(12) United States Patent
Katogi et al.

(10) Patent No.: US 8,518,303 B2
(45) Date of Patent: Aug. 27, 2013

(54) ADHESIVE COMPOSITION, CIRCUIT CONNECTING MATERIAL, CONNECTION STRUCTURE OF CIRCUIT MEMBER, AND SEMICONDUCTOR DEVICE

(75) Inventors: Shigeki Katogi, Tsukuba (JP); Hiroyuki Izawa, Tsukuba (JP); Houko Sutou, Hitachi (JP); Masami Yusa, Tsukuba (JP); Tohru Fujinawa, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 970 days.

(21) Appl. No.: 11/908,897

(22) PCT Filed: Mar. 15, 2006

(86) PCT No.: PCT/JP2006/305092
§ 371 (c)(1),
(2), (4) Date: Jul. 22, 2009

(87) PCT Pub. No.: WO2006/098352
PCT Pub. Date: Sep. 21, 2006

(65) Prior Publication Data
US 2009/0309220 A1 Dec. 17, 2009

(30) Foreign Application Priority Data

Mar. 16, 2005 (JP) ................ P2005-074913
Mar. 16, 2005 (JP) ................ P2005-074999

(51) Int. Cl.
*H01B 1/00* (2006.01)
*H01L 23/48* (2006.01)
*H05K 1/11* (2006.01)
*C08F 8/00* (2006.01)

(52) U.S. Cl.
USPC .............. 252/500; 257/741; 361/803; 525/55

(58) Field of Classification Search
USPC ................................................ 252/500–521.6
See application file for complete search history.

(56) References Cited

U.S. PATENT DOCUMENTS

| 6,039,896 A | | 3/2000 | Miyamoto et al. |
| 6,042,894 A | * | 3/2000 | Goto et al. ................... 427/504 |
| 6,060,215 A | * | 5/2000 | Amanokura et al. ...... 430/281.1 |
| 6,416,838 B1 | | 7/2002 | Arney et al. |
| 6,440,519 B1 | | 8/2002 | Takase et al. |

(Continued)

FOREIGN PATENT DOCUMENTS

| CN | 1242403 A | 1/2000 |
| CN | 1369531 A | 9/2002 |

(Continued)

OTHER PUBLICATIONS

Supplemental European Search Report issued in a counterpart application No. 06729113.8, completed Mar. 30, 2010 and mailed Apr. 8, 2010.

(Continued)

*Primary Examiner* — Mark Kopec
*Assistant Examiner* — Jaison Thomas
(74) *Attorney, Agent, or Firm* — Griffin & Szipl, P.C.

(57) ABSTRACT

The adhesive composition of the invention comprises a radical generator, a thermoplastic resin and a urethane(meth)acrylate having two or more radical-polymerizing groups in the molecule and a weight-average molecular weight of 3000-30,000.

15 Claims, 3 Drawing Sheets

(56) References Cited

U.S. PATENT DOCUMENTS

| | | | |
|---|---|---|---|
| 6,762,249 B1 * | 7/2004 | Fujinawa et al. ............ 525/455 |
| 6,827,880 B2 | 12/2004 | Ishimatsu | |
| 7,141,645 B2 | 11/2006 | Fujinawa et al. | |
| 7,208,105 B2 | 4/2007 | Nomura et al. | |
| 2002/0109124 A1 | 8/2002 | Ishimatsu | |
| 2003/0141014 A1 | 7/2003 | Satoyuki et al. | |
| 2003/0236362 A1 | 12/2003 | Bluem et al. | |
| 2004/0214979 A1 | 10/2004 | Fujinawa et al. | |
| 2007/0166549 A1 | 7/2007 | Nomura et al. | |
| 2010/0294551 A1 | 11/2010 | Nomura et al. | |

FOREIGN PATENT DOCUMENTS

| | | | |
|---|---|---|---|
| CN | 1375179 A | 10/2002 | |
| CN | 1425192 | 6/2003 | |
| CN | 101142292 A | 3/2008 | |
| EP | 1 223 795 A1 | 7/2002 | |
| JP | 1-113480 | 5/1989 | |
| JP | 06-49420 | 2/1994 | |
| JP | 8-188757 | 7/1996 | |
| JP | H10-095822 | * | 4/1998 |
| JP | H10-287718 A | 10/1998 | |
| JP | 2000-219850 A | 8/2000 | |
| JP | 2000256641 A | 9/2000 | |
| JP | 3151062 B2 | 1/2001 | |
| JP | 2001226647 A | 8/2001 | |
| JP | 2001262079 A | * | 9/2001 |
| JP | 2002-501556 A | 1/2002 | |
| JP | 2002-203427 | 7/2002 | |
| JP | 2002285128 | 10/2002 | |
| JP | 2003-513122 A | 4/2003 | |
| JP | 2003-313514 A | 11/2003 | |
| JP | 3522634 | 2/2004 | |
| JP | 2004-0175866 | 6/2004 | |
| JP | 2004327801 A | 11/2004 | |
| JP | 2005-026547 | 1/2005 | |
| WO | 01-15505 A1 | 3/2001 | |
| WO | 01-82363 A1 | 11/2001 | |

OTHER PUBLICATIONS

International Search Report issued in corresponding application No. PCT/JP2006/305092, completed Jun. 8, 2006 and mailed Jun. 20, 2006.

Office Action issued Jan. 5, 2011 in a counterpart Chinese application 200680008174.6.

Notice of Allowance issued in counterpart Taiwanese application 095109011 on May 29, 2012 (no translation available; submitted for certification).

Notice of Allowance issued May 10, 2011 in a basic Japanese patent application P2005-074999.

Notice of Allowance issued May 10, 2011 in a basic Japanese patent application P2005-074913.

Office Action issued in counterpart Chinese application 201110220510.6 on Feb. 1, 2013 (no translation available, submitted for certification).

Japanese office action issued in counterpart application 2011-063032 on Apr. 16, 2013 (no translation available; submitted for certification).

Japanese office action issued in counterpart application 2011-063076 on Apr. 16, 2013 (no translation available; submitted for certification).

Chinese office action issued in counterpart application 201110223300.2 on Apr. 9, 2013 (no translation available; submitted for certification).

* cited by examiner

ADHESIVE COMPOSITION, CIRCUIT CONNECTING MATERIAL, CONNECTION STRUCTURE OF CIRCUIT MEMBER, AND SEMICONDUCTOR DEVICE

This is a National Phase Application in the United States of International Patent Application No. PCT/JP2006/305092 filed Mar. 15, 2006, which claims priority on Japanese Patent Application Nos. P2005-074999 and P2005-074913, both filed Mar. 16, 2005. The entire disclosures of the above patent applications are hereby incorporated by reference.

TECHNICAL FIELD

The present invention relates to an adhesive composition, as well as to a circuit-connecting material and to a circuit connection structure and a semiconductor device that employ it.

BACKGROUND ART

Several different types of adhesive materials have been used in recent years in the fields of semiconductors and liquid crystal displays, for anchoring of electronic parts and for circuit connection. As such uses continue to require higher density and higher definition, the adhesives used must also exhibit higher adhesive force and reliability. The adherends used in bonding include printed circuit boards, organic substrates composed of heat resistant polymers such as polyimides, and metals such as copper, tin, nickel or aluminum and other inorganic materials such as ITO, $Si_3N_4$ and $SiO_2$. Adhesives are also used for bonding between different types of the substrates mentioned above. The adhesives must therefore exhibit a wide range of properties in addition to superior adhesion, including high heat resistance and high reliability under high-temperature, high-humidity conditions, while also having a molecular design suitable for each adherend.

In particular, anisotropic conductive adhesives having conductive particles dispersed in adhesives are employed as circuit-connecting materials (circuit-connecting adhesives) used for connection between circuits such as between liquid crystal displays and TCPs, between FPCs and TCPs or between FPCs and printed circuit boards. Such adhesives used for semiconductors and liquid crystal displays have conventionally been thermosetting resin compositions comprising epoxy resins that exhibit high adhesion and high reliability (for example, see Patent document 1).

The constituent components of thermosetting resin compositions include epoxy resins and curing agents such as phenol resins that are reactive with epoxy resins. Thermal latent catalysts that promote reaction between epoxy resins and curing agents are also sometimes included in adhesives. For example, one-pack type epoxy resin adhesives employing thermal latent catalysts are employed in film, paste or powder forms since they do not require mixture of the base compound (epoxy resin) and the curing agent and are convenient to use. The thermal latent catalysts are major factors determining curing temperature and curing speed, and various compounds are used as thermal latent catalysts from the viewpoint of room temperature storage stability and curing speed during heating.

In actual adhesion steps using such adhesives, the adhesives are cured under curing conditions with a 170° C.-250° C. temperature for 1-3 hours to obtain the desired adhesive force. However, as the increasing integration of semiconductor elements and higher precision of liquid crystal devices in recent years are leading to ever narrowing pitches between elements and wirings, the heating of curing can produce adverse effects on the surrounding materials. In addition, the electrode widths and electrode spacings are becoming even more extremely narrow while electrode heights are decreasing. Therefore, it is not always possible to achieve sufficient adhesive force with conventional circuit connection adhesives, and problems such as shifting of wirings can occur. Moreover, since another goal is to shorten the duration of adhesion steps to reduce cost, it is desirable to accomplish curing and bonding at lower temperatures and in shorter times.

Radical-type adhesives which combine radical polymerizing compounds such as acrylate derivatives or methacrylate derivatives (hereinafter referred to as "(meth)acrylate derivatives") with peroxides as radical polymerization initiators have become objects of interest in recent years as means of achieving lower temperature and shorter times. Radical curing with adhesives can be accomplished at low temperature and in a short period of time because of the high reactivity of the reactive radical species (for example, see Patent document 2). However, it has been noted that the adhesive strength is inferior to that of epoxy resins because of the high cure shrinkage during curing of the radical curing adhesives. It has been found that the adhesive strength for inorganic material or metal material substrates is particularly low.

Methods of enhancing adhesive strength, such as methods of imparting pliability by including ether bonds in cured adhesives in order to increase the adhesive strength, have therefore been proposed (see Patent documents 3 and 4). Such enhancing methods employ urethane acrylate compounds as the radical polymerizing compounds.

[Patent document 1] Japanese Patent Application Laid-open No. 1-113480
[Patent document 2] Japanese Patent Application Laid-open No. 2002-203427
[Patent document 3] Japanese Patent Publication No. 3522634
[Patent document 4] Japanese Patent Application Laid-open No. 2002-285128

DISCLOSURE OF THE INVENTION

Problems to be Solved by the Invention

Nevertheless using the aforementioned urethane acrylate compounds can impart an excessive degree of pliability to cured adhesives, as a result of ether bonding. The physical properties of the adhesives are therefore inferior, due to reduction in the elastic modulus and glass transition temperature of the cured product, and impairment of its water resistance, heat resistance and mechanical strength. Such adhesives cannot exhibit adequate performance (adhesive strength, connection resistance, etc.) in reliability tests where they are allowed to stand under high temperature, high humidity conditions of 85° C./85% RH. The pressure-sensitive adhesive properties of such adhesives are also too strong, and therefore when a film-like adhesive is formed by laminating a layer of the adhesive onto a releasable support film, the adhesive is transferred onto the backing support film while transfer onto the adherend fails to occur satisfactorily.

In order to obtain adhesives that cure and bond at lower temperatures and in shorter periods of time than the prior art, there may be employed thermal latent catalysts with low activation energy. However, using such thermal latent catalysts makes it extremely difficult to also achieve sufficient storage stability at near room temperature.

The present invention therefore provides an adhesive composition circuit-connecting material with an excellent balance of properties, which despite being a radical curing adhesive exhibits sufficiently high adhesive strength even for substrates composed of metals and inorganic materials, has adequately high storage stability and reliability at room temperature (20-30° C.) and satisfactory transfer properties onto adherends, and can satisfactorily achieve temporary anchoring of flexible wiring boards and the like, as well as a circuit connection structure and semiconductor device that employ the above.

Means for Solving the Problems

The invention relates to an adhesive composition comprising a radical generator, a thermoplastic resin and a urethane (meth)acrylate having two or more radical-polymerizing groups in the molecule and a weight-average molecular weight of 3000-30,000.

The adhesive composition of the invention exhibits sufficiently high adhesive strength for substrates composed of metals and inorganic materials, despite being a radical curing adhesive. According to the invention it is possible to provide an adhesive composition that has adequately high storage stability and reliability at room temperature (20-30° C.) and satisfactory transfer properties onto adherends, and that can satisfactorily achieve temporary anchoring of flexible wiring boards and the like.

The invention relates to the aforementioned adhesive composition wherein the urethane(meth)acrylate includes a urethane(meth)acrylate having in the molecule a divalent organic group represented by the following formula (B) and/or the following general formula (C).

[Chemical Formula 1]

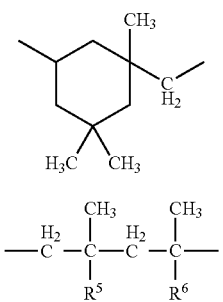

(B)

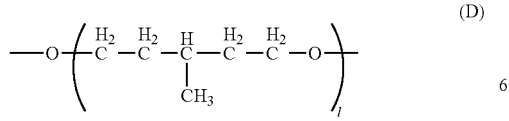

(C)

In formula (C), $R^5$ and $R^6$ respectively represent hydrogen and methyl, or methyl and hydrogen.

The invention also relates to the aforementioned adhesive composition wherein the urethane(meth)acrylate includes a urethane(meth)acrylate having in the molecule one or more groups selected from the group consisting of divalent organic groups represented by the following general formulas (D), (E) and (F).

[Chemical Formula 2]

(D)

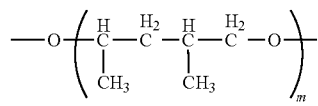

(E)

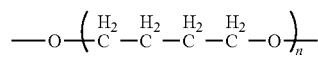

(F)

The letters l, m and n in formulas (D), (E) and (F) each represent an integer of 1-60.

The invention further relates to the aforementioned adhesive composition wherein the urethane(meth)acrylate includes a compound represented by the following general formula (A).

[Chemical Formula 3]

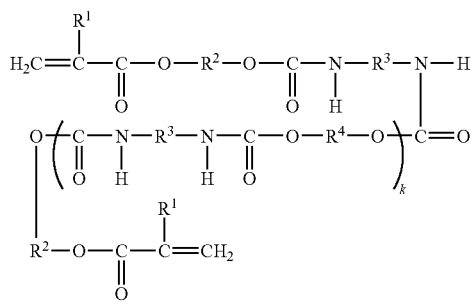

(A)

In formula (A), $R^1$ represents hydrogen or a methyl group, $R^2$ represents a C1-4 straight-chain or branched alkylene group, $R^3$ represents a divalent organic group with an aliphatic hydrocarbon group, $R^4$ represents a straight-chain or branched divalent diol compound residue, and k represents an integer of 1-60. The plurality of groups $R^1$, $R^2$ and $R^3$ in the molecule and the group $R^4$ where k is an integer of 2-60 may be the same or different.

The invention further relates to the aforementioned adhesive composition wherein $R^3$ is at least one group selected from the group consisting of divalent organic groups represented by formula (B) and general formula (C) above.

The invention further relates to the aforementioned adhesive composition wherein ($-O-R^4-O-$) is at least one group selected from the group consisting of divalent organic groups represented by general formulas (D), (E) and (F) above.

The invention still further relates to an adhesive composition comprising a radical generator, a thermoplastic resin and a urethane(meth)acrylate having two or more (meth)acryloyl groups and two or more urethane bonds in the molecule, and also having a divalent group represented by the following general formula (G) and/or formula (H).

[Chemical Formula 4]

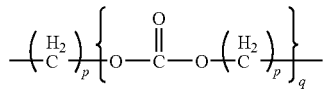

(G)

-continued

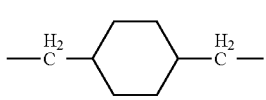
(H)

In formula (G), p represents an integer of 0-10 and q represents an integer of 1-20.

The invention further relates to the aforementioned adhesive composition wherein the urethane(meth)acrylate includes a compound represented by the following general formula (I).

[Chemical Formula 5]

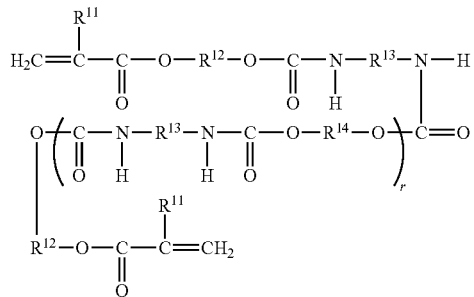
(I)

In formula (I), $R^{11}$ represents hydrogen or a methyl group, $R^{12}$ represents a C1-4 straight-chain or branched alkylene group, $R^{13}$ represents a divalent organic group with an aliphatic hydrocarbon group, $R^{14}$ represents a divalent group represented by general formula (G) and/or formula (H) above, and r represents an integer of 1-60. The plurality of $R^{11}$, $R^{12}$ and $R^{13}$ groups in the molecule and $R^{14}$ where r is an integer of 2-60 may be the same or different.

The invention still further relates to the aforementioned adhesive composition wherein $R^{12}$ represents an ethylene group, $R^{13}$ is a group represented by formula (B) above, p is an integer of 1-10 and r is an integer of 1-40.

The invention still further relates to the aforementioned adhesive composition wherein the temporary anchoring force for temporary anchoring onto a flexible wiring board is 50 gf/cm-150 gf/cm.

The invention still further relates to the aforementioned adhesive composition wherein the 25° C. viscosity of the urethane(meth)acrylate is 5.0 Pa·s or greater.

The invention still further relates to the aforementioned adhesive composition, which comprises 10-250 parts by weight of the urethane(meth)acrylate and 0.05-30 parts by weight of the radical generator with respect to 100 parts by weight of the thermoplastic resin.

The invention still further relates to the aforementioned adhesive composition, which also comprises a vinyl compound containing one or more phosphate groups in the molecule.

The invention still further relates to the aforementioned adhesive composition, which comprises 0.1-20 parts by weight of the vinyl compound with respect to 100 parts by weight of the thermoplastic resin.

The invention still further relates to the aforementioned adhesive composition, which also comprises conductive particles.

The invention still further relates to the aforementioned adhesive composition, which comprises 0.5-30 parts by weight of the conductive particles with respect to 100 parts by weight of the thermoplastic resin.

The invention still further relates to a circuit-connecting material for electrical connection between opposing circuit electrodes, the circuit-connecting material comprising the aforementioned adhesive composition.

The invention still further relates to a circuit member connection structure provided with a first circuit member obtained by forming a first circuit electrode on the main surface of a first circuit board, a second circuit member obtained by forming a second circuit electrode on the main surface of a second circuit board, and a circuit-connecting member formed between the main surface of the first circuit board and the main surface of the second circuit board, electrically connecting the first circuit electrode and second circuit electrode which are laid facing each other, wherein the circuit-connecting member is the product of curing the circuit-connecting material.

The invention still further relates to a semiconductor device comprising a semiconductor element, a substrate on which the semiconductor element is mounted, and a semiconductor element connecting member provided between the semiconductor element and the substrate and electrically connecting the semiconductor element and the substrate, characterized in that the semiconductor element connecting member is the product of curing the aforementioned adhesive composition.

Effect of the Invention

The present invention provides an adhesive composition with an excellent balance of properties, which despite being a radical curing adhesive, exhibits sufficiently high adhesive strength even for substrates composed of metals and inorganic materials, has adequately high storage stability and reliability at room temperature (20-30° C.) and satisfactory transfer properties onto adherends, and can satisfactorily achieve temporary anchoring of flexible wiring boards and the like.

EXPLANATION OF SYMBOLS

Figure 1:
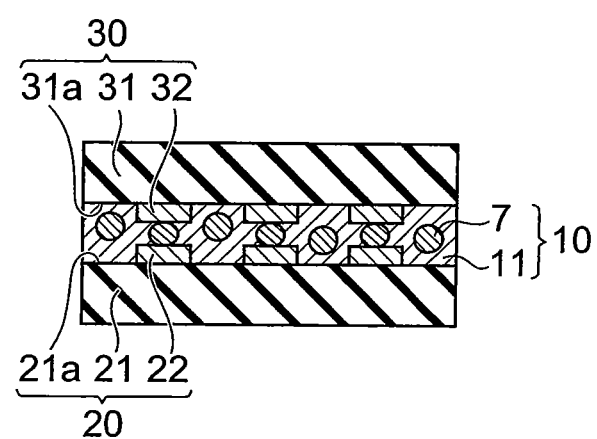
FIG. 1 is a simplified cross-sectional view showing an embodiment of a circuit member connection structure according to the invention.

2: Semiconductor device, 7: conductive particles, 10: circuit-connecting member, 11: insulating material, 20: first circuit member, 21: first circuit board, 22: first circuit electrode, 30: second circuit member, 31: second circuit board, 32: second circuit electrode, 40: semiconductor element connecting member, 50: semiconductor element, 60: substrate, 61: circuit pattern, 70: sealing material.

BEST MODE FOR CARRYING OUT THE INVENTION

Preferred embodiments of the invention will now be explained in detail, with reference to the accompanying drawings as necessary. Throughout the drawings, corresponding elements will be referred to by like reference numerals and will be explained only once. Unless otherwise specified, the vertical and horizontal positional relationships are based on the positional relationships in the drawings. The dimensional proportions in the drawings are not restricted to the proportions shown. The term "(meth)acrylic" used throughout the present specification refers to "acrylic" and its corresponding "methacrylic", the term "(meth)acrylate" refers to "acrylate" and its corresponding "methacrylate", the term "(meth)acryloxy" refers to "acryloxy" and its corresponding "methacryloxy", and the term "(meth)acryloyl" refers to "acryloyl" and its corresponding "methacryloyl".

The adhesive composition according to the first embodiment of the invention comprises a radical generator, a thermoplastic resin and a urethane(meth)acrylate having two or more radical-polymerizing groups in the molecule and a weight-average molecular weight of 3000-30,000. Each of the components mentioned above will now be described in detail.

The radical generator, also known as radical polymerization initiator, is not particularly restricted so long as it is a compound that generates radicals by heat or light. Examples of radical generators include peroxides, azo compounds and the like, and they may be selected in consideration of the desired connection temperature, connection time and storage stability (hereinafter also referred to as "shelf life"). Such radical generators may be used alone or in combinations of two or more. From the standpoint of high reactivity and long shelf life, the radical generator preferably is an organic peroxide with a 10 hour half-life temperature of 40° C. or higher and a 1 minute half-life temperature of no higher than 180° C., and most preferably it is an organic peroxide with a 10 hour half-life temperature of 50° C. or higher and a 1 minute half-life temperature of no higher than 170° C. If the connection time is 10 seconds or shorter, the radical generator content with respect to the total adhesive composition is preferably 1-20 wt % and more preferably 2-15 wt % in order to achieve a satisfactory reaction rate.

As specific examples of the aforementioned organic peroxides there may be mentioned diacyl peroxides, peroxy dicarbonates, peroxyesters, peroxyketals, dialkyl peroxides, hydroperoxides and silyl peroxides, as well as their derivatives. They may be used alone or in combinations of two or more. The organic peroxide used is preferably selected from the group consisting of peroxyesters, dialkyl peroxides, hydroperoxides and silyl peroxides, or their derivatives. Preferred organic peroxides have no more than 5000 ppm of chloride ions and organic acids in the radical generator, with low organic acid generation after thermolysis, so that corrosion of connection terminals of circuit members can be further inhibited.

As examples of diacyl peroxides and their derivatives there may be mentioned isobutyl peroxide, 2,4-dichlorobenzoyl peroxide, 3,5,5-trimethylhexanoyl peroxide, octanoyl peroxide, lauroyl peroxide, stearoyl peroxide, succinic peroxide, benzoylperoxytoluene and benzoyl peroxide. They may be used alone or in combinations of two or more.

As examples of peroxy dicarbonates and their derivatives there may be mentioned di-n-propylperoxy dicarbonate, diisopropylperoxy dicarbonate, bis(4-t-butylcyclohexyl)peroxy dicarbonate, di-2-ethoxymethoxyperoxy dicarbonate, di(2-ethylhexylperoxy)dicarbonate, dimethoxybutylperoxy dicarbonate and di(3-methyl-3-methoxybutylperoxy)dicarbonate. They may also be used alone or in combinations of two or more.

As examples of peroxyesters and their derivatives there may be mentioned cumylperoxy neodecanoate, 1,1,3,3-tetramethylbutylperoxy neodecanoate, 1-cyclohexyl-1-methylethylperoxy neodecanoate, t-hexylperoxy neodecanoate, t-butylperoxy pivalate, 1,1,3,3-tetramethylbutylperoxy-2-ethyl hexanoate, 2,5-dimethyl-2,5-di(2-ethylhexanoylperoxy)hexane, 1-cyclohexyl-1-methylethylperoxy-2-ethyl hexanoate, t-hexylperoxy-2-ethyl hexanoate, t-butylperoxy-2-ethyl hexanonate, t-butylperoxy isobutyrate, 1,1-bis(t-butylperoxy)cyclohexane, t-hexylperoxyisopropyl monocarbonate, t-butylperoxy-3,5,5-trimethyl hexanoate, t-butylperoxy laurate, 2,5-dimethyl-2,5-di(m-toluoylperoxy) hexane, t-butylperoxyisopropyl monocarbonate, t-butylperoxy-2-ethylhexyl monocarbonate, t-hexylperoxybenzoate, t-butylperoxy acetate and dibutylperoxy hexahydroterephthalate. They may also be used alone or in combinations of two or more.

As examples of peroxyketals and their derivatives there may be mentioned 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy) cyclododecane and 2,2-bis(t-butylperoxy)decane. They may also be used alone or in combinations of two or more.

As examples of dialkyl peroxides and their derivatives there may be mentioned α,α'-bis(t-butylperoxy)diisopropylbenzene, dicumyl peroxide, 2,5-dimethyl-2,5-di(t-butylperoxy)hexane and t-butylcumyl peroxide. They may also be used alone or in combinations of two or more.

As examples of hydroperoxides and their derivatives there may be mentioned diisopropylbenzene hydroperoxide and cumene hydroperoxide. They may also be used alone or in combinations of two or more.

As examples of silyl peroxides and their derivatives there may be mentioned t-butyltrimethylsilyl peroxide, bis(t-butyl) dimethylsilyl peroxide, t-butyltrivinylsilyl peroxide, bis(t-butyl)divinylsilyl peroxide, tris(t-butyl)vinylsilyl peroxide, t-butyltriallylsilyl peroxide, bis(t-butyl)diallylsilyl peroxide and tris(t-butyl)allylsilyl peroxide. They may also be used alone or in combinations of two or more.

From the viewpoint of a satisfactory balance between stability, reactivity and compatibility, the radical generator is preferably a peroxyester or a derivative thereof having a 1 minute half-life temperature of 90-175° C. and a molecular weight of 180-1000.

In order to prevent corrosion of the connection terminals of the circuit members, the chloride ion or organic acid content of the radical generator is preferably no greater than 5000 ppm by weight. The radical generator is more preferably one with minimal production of organic acids after thermolysis. In order to improve the stability of the fabricated circuit-connecting material, the radical generator preferably has a mass retention of at least 20 wt % after standing at room temperature and ordinary pressure for 24 hours. Here, the "mass retention" is the mass proportion of the radical generator remaining after standing based on the mass of the radical generator before standing.

Such radical generators may also be used in admixture with triggers, inhibitors and the like.

These radical generators are also preferably coated with a polyurethane-based or polyester-based polymer substance and made into microcapsules for an extended pot life.

The mixing proportion of the radical generator in the adhesive composition is preferably 0.05-30 parts by weight and more preferably 0.1-20 parts by weight with respect to 100 parts by weight of the thermoplastic resin described hereunder. If the mixing proportion is below 0.05 part by weight the adhesive composition will tend to be difficult to cure, while if it exceeds 30 parts by weight the storage stability will tend to be lower.

The thermoplastic resin used is not particularly restricted and may be any known one. As examples of such thermoplastic resins there may be mentioned polyimides, polyamides, phenoxy resins, poly(meth)acrylates, polyimides, polyurethanes, polyesters and polyvinyl butyral, as well as their derivatives. They may also be used alone or in combinations of two or more. These thermoplastic resins may also have siloxane bonds or fluorine-substituted groups in the molecule. When such thermoplastic resins are used in admixture, the mixed thermoplastic resins are preferably either completely miscible or produce microphase separation to a state of opacity.

The thermoplastic resin will exhibit more satisfactory film formability with a larger molecular weight, and the melt viscosity, which affects the flow property as an adhesive may be set within a wide range. The molecular weight of the thermoplastic resin is not particularly restricted so long as it can achieve the object of the invention, but for most purposes the molecular weight is preferably 5000-150,000 and more preferably 10,000-80,000 as the weight-average molecular weight. A weight-average molecular weight of less than 5000 will tend to reduce the film formability, while greater than 150,000 will tend to lower the compatibility with the other components. Throughout the present specification, the weight-average molecular weight is measured by GPC (gel permeation chromatography) and calculated based on standard polystyrene.

The urethane(meth)acrylate having two or more radical-polymerizing groups in the molecule and a weight-average molecular weight of 3000-30,000 is not particularly restricted so long as it is a compound with at least two urethane bonds and one or more (meth)acrylate structures in the molecule.

The weight-average molecular weight of the urethane (meth)acrylate used for this embodiment is the value measured by GPC (gel permeation chromatography) and calculated based on standard polystyrene. From the viewpoint of improving the heat resistance, flow property and adhesion, the urethane(meth)acrylate for this embodiment preferably has a weight-average molecular weight of 3000-30,000 and more preferably 5000-15,000. If the urethane(meth)acrylate has a weight-average molecular weight within the aforementioned numerical value range, it will be possible to impart suitable adhesive force and pressure-sensitive adhesive force to the adhesive composition, to accomplish temporary anchoring with high temporary anchoring force for tape carrier packages (TCP), chip-on-flexes (COF) and flexible printed circuit boards (FPC), and to obtain satisfactory transfer onto adherends. If the weight-average molecular weight is less than 3000, the crosslink density will be increased and cure shrinkage will tend to lower the adhesive strength of the adhesive composition. If the weight-average molecular weight of the urethane(meth)acrylate is less than 3000, the pressure-sensitive adhesive property of the adhesive composition will be increased. Therefore, when a tape product is formed by laminating a layer comprising the adhesive composition with a releasable support film and the product is wound around a winding core of several tens of meters or larger and allowed to stand for an extended period at room temperature, the layer comprising the adhesive composition is transferred onto the backing releasable support film, tending to prevent the desired tape product from being extracted from the reel. In addition, after the layer comprising the adhesive composition has been attached to a flexible wiring board, the layer cannot be easily released from the flexible wiring board and the repairability thus tends to be impaired. On the other hand, a weight-average molecular weight exceeding 30,000 will tend to lower the crosslink density and reduce the connection reliability of the adhesive composition. In addition, the pressure-sensitive adhesive property of the adhesive composition will become too weak, making it very difficult to achieve transfer onto circuit boards. Also, when a flexible wiring board is attached onto the layer comprising the adhesive composition, the flexible wiring board will be more prone to flaking.

The weight-average molecular weights of the urethane (meth)acrylates mentioned throughout the present specification were measured under the following conditions.
Measuring apparatus: GPC-8020 (trade name of Tosoh Corp.)
Detector: RI-8020 (trade name of Tosoh Corp.)
Column: Gelpack GL-A-160-S and GL-A150-SG2000Hhr (both trade names of Hitachi Chemical Co., Ltd.) columns linked in series.
Sample concentration: 120 mg/3 mL
Solvent: Tetrahydrofuran
Injection rate: 60 μL
Pressure: 30 kgf/cm$^2$
Flow rate: 1.00 mL/min The urethane(meth)acrylate of this embodiment preferably has a divalent organic group represented by the following formula (B) and/or general formula (C) in the molecule.

[Chemical Formula 6]

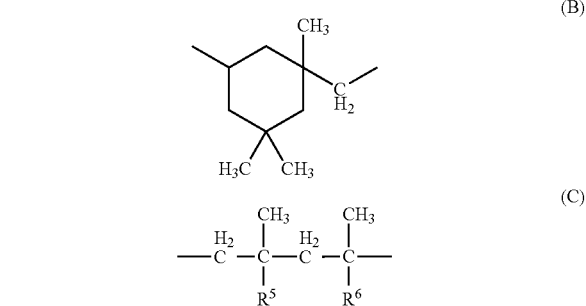

In formula (C), $R^5$ and $R^6$ respectively represent hydrogen and methyl or methyl and hydrogen.

This will allow further improvement in the adhesion and repairability of the adhesive composition. From the same viewpoint, the urethane(meth)acrylate of this embodiment preferably has both of the aforementioned divalent organic groups in the molecule. In cases where the urethane(meth) acrylate of this embodiment has both of the aforementioned divalent organic groups in the molecule, there is no particular limitation on their proportion. When the urethane(meth)acrylate of this embodiment has a divalent organic group represented by general formula (C) above in the molecule, it may have one or more divalent organic groups of that type.

By introduction of asymmetrical or branched molecular chains such as the aforementioned divalent organic groups, for example, into the urethane(meth)acrylate of this embodiment, the cured adhesive composition will exhibit suitable pliability, adhesion and pressure-sensitive adhesive properties. In addition, high reliability can be ensured for connections formed between different materials using the adhesive composition.

From the standpoint of improving the flow property, adhesion and pressure-sensitive adhesive property, the urethane (meth)acrylate of this embodiment preferably includes a urethane(meth)acrylate having at least one group in the molecule selected from the group consisting of divalent organic groups represented by the following general formulas (D), (E) and (F).

[Chemical Formula 7]

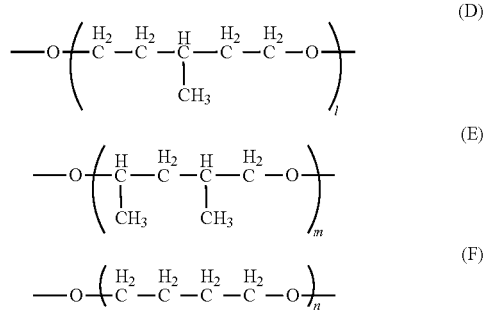

In formulas (D), (E) and (F), l, m and n each represent an integer of 1-60.

Urethane(meth)acrylates having more than one of such groups may comprise them in any desired proportion. When a plurality of urethane(meth)acrylates have such groups, the proportion of the groups in the total urethane(meth)acrylates in the adhesive composition may be as desired.

If branched molecular chains are introduced into the aforementioned urethane(meth)acrylates not at the ends but within the chains, with a suitable distance between the ether groups, it is possible to impart a suitable degree of pliability, adhesion and pressure-sensitive adhesion to the cured adhesive composition of this embodiment, to obtain high reliability for connection between different types of materials.

The urethane(meth)acrylate of this embodiment preferably contains a compound represented by the following general formula (A).

[Chemical Formula 8]

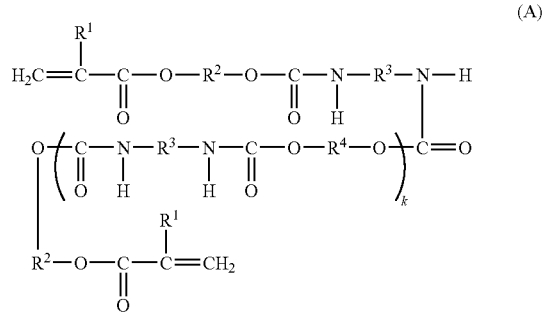

In formula (A), $R^1$ represents hydrogen or a methyl group, $R^2$ represents a C1-4 straight-chain or branched alkylene group, $R^3$ represents a divalent organic group with an aliphatic hydrocarbon group, $R^4$ represents a straight-chain or branched divalent diol residue and k represents an integer of 1-60. The plurality of groups $R^1$, $R^2$ and $R^3$ in the molecule and the group $R^4$ where k is an integer of 2-60 may be the same or different.

The urethane(meth)acrylate of this embodiment which is a compound represented by general formula (A) above may be obtained, for example, by reacting a diol compound with a diisocyanate compound and a (meth)acrylate compound which has an alcoholic hydroxyl group. Alternatively, the urethane(meth)acrylate of this embodiment may be obtained by reacting a diisocyanate compound with a (meth)acrylate that has an alcoholic hydroxyl group.

As examples of diisocyanate compounds there may be mentioned diisocyanates, including aromatic diisocyanates such as 2,4-tolylene diisocyanate, 2,6-tolylene diisocyanate, xylene-1,4-diisocyanate, xylene-1,3-diisocyanate, 4,4'-diphenylmethane diisocyanate, 2,4'-diphenylmethane diisocyanate, 4,4'-diphenyl ether diisocyanate, 2,2'-diphenylpropane-4,4'-diisocyanate, 3,3'-dimethyldiphenylmethane-4,4'-diisocyanate, 4,4'-diphenylpropane diisocyanate, 1,3-diisocyanatebenzene, 1,4-diisocyanatebenzene, naphthylene-1,4-diisocyanate, naphthylene-1,5-diisocyanate and 3,3'-dimethoxydiphenyl-4,4'-diisocyanate; aliphatic diisocyanates such as tetramethylene diisocyanate, hexamethylene diisocyanate, decamethylene diisocyanate, lysine diisocyanate, trans-1,4-cyclohexane diisocyanate and 2,2,4-trimethylhexane diisocyanate; and alicyclic diisocyanates such as isophorone diisocyanate, hydrogenated tolylene diisocyanate, hydrogenated xylene diisocyanate, hydrogenated diphenylmethane diisocyanate and tetramethylxylene diisocyanate. These may also be used alone or in combinations of two or more. Particularly preferred as diisocyanate compounds are aliphatic diisocyanates such as 2,2,4-trimethylhexane diisocyanate and hexamethylene diisocyanate.

As examples of diol compounds there may be mentioned ether diols, ester diols and carbonate diols, as well as condensation products and copolymers obtained using one or more of them as starting materials. These may also be used alone or in combinations of two or more.

As examples of ether diols there may be mentioned polyol compounds including straight-chain or branched alkylene glycol or diol compounds such as ethylene glycol, 1,3-propanediol, propylene glycol, 2,3-butanediol, 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 1,9-decanediol, 1,9-nonanediol, 1,4-cyclohexanediol-1,4-dimethylol, 2,2-diethylpropane-1,3-diol, 2,2-dimethylpropane-1,3-diol, 3-methylpentane-1,4-diol, 3-methyl-1,5-pentanediol, 2,2-diethylbutane-1,3-diol, 4,5-nonanediol, diethylene glycol, triethylene glycol, dipropylene glycol, neopentyl glycol, glycerin, pentaerythritol, erythritol, sorbitol, mannitol, trimethylolpropane, trimethylolethane, 2,2-dimethyl-3-hydroxypropyl-2,2-dimethyl-3-hydroxy propionate and 2-butene-1,4-diol; and other polyhydric alcohol compounds such as bisphenol A, hydroquinones and their alkylene oxide adducts, as well as condensation products and copolymers obtained using one or more of them as starting materials. These may also be used alone or in combinations of two or more.

An ester diol may be obtained by condensation polymerization of one or more different dicarboxylic acids and diol compounds by ordinary methods. As dicarboxylic acids there may be mentioned aromatic dicarboxylic acids such as terephthalic acid, isophthalic acid, phthalic acid, 1,4-naphthalenedicarboxylic acid, 2,5-naphthalenedicarboxylic acid, 2,6-naphthalenedicarboxylic acid, naphthalic acid, biphenyldicarboxylic acid and 1,2-bis(phenoxy)ethane-p,p-dicarboxylic acid, as well as their anhydrides and ester-forming derivatives; and aromatic hydroxycarboxylic acids such as p-hydroxybenzoic acid and p-(2-hydroxyethoxy)benzoic acid, as well as their ester-forming derivatives. As other examples of dicarboxylic acids there may be mentioned aliphatic dicarboxylic acids such as succinic acid, adipic acid, azelaic acid, sebacic acid, maleic anhydride and fumaric acid, alicyclic dicarboxylic acids such as 1,3-cyclopentanedicarboxylic acid and 1,4-cyclohexanedicarboxylic acid, and their anhydrides and ester-forming derivatives. The ester diol may be of a single type or a combination of more than one types.

As examples of carbonate diols there may be mentioned dialkyl carbonates, dialkylene carbonates and diphenyl carbonates, as well as polycarbonatediols of condensation products or copolymers obtained using one or more of them as starting materials. These may be used alone or in combinations of two or more.

The number of repeating units k of the urethane(meth)acrylate represented by general formula (A) is preferably 1-50 and more preferably 5-30. If the number of repeating units k is greater than 60, the crosslink density will tend to be lower and the connection reliability reduced.

From the viewpoint of improving adhesion and repairability, $R^3$ in general formula (A) preferably has one or more groups selected from the group consisting of divalent organic groups represented by formula (B) and general formula (C) above, and more preferably it is at least one group selected from the group consisting of divalent organic groups represented by formula (B) and general formula (C) above. One group represented by general formula (C) may be used alone, or two or more different ones may be used in combination.

By introducing an asymmetric or branched molecular chain into $R^3$ of general formula (A), it is possible to impart suitable pliability, adhesion and/or pressure-sensitive adhesion to the cured adhesive composition. This can produce high reliability for connections formed using the adhesive composition of this embodiment, even for connections between materials of different types.

From the standpoint of improving the flow property, adhesion and pressure-sensitive adhesion, the divalent group (—O—$R^4$—O—) in general formula (A) preferably has at least one group selected from the group consisting of divalent organic groups represented by general formulas (D), (E) and (F), and more preferably it is one or more groups selected from the group consisting of divalent organic groups represented by general formulas (D), (E) and (F). When two or more groups selected from the group consisting of divalent organic groups represented by general formulas (D), (E) and (F) are introduced into the molecule of the urethane(meth)acrylate, there is no particular limitation on their proportion.

If branched molecular chains are introduced as (—O—$R^4$—O—) not at the ends but within the chain of the compound represented by general formula (A), it is possible to impart a suitable degree of pliability, adhesion and/or pressure-sensitive adhesion to the cured adhesive composition. This can produce high reliability for connections formed using the adhesive composition of this embodiment, even for connections between materials of different types.

The adhesive composition according to the second embodiment of the invention comprises a radical generator, a thermoplastic resin and a urethane(meth)acrylate having two or more (meth)acryloyl groups and two or more urethane bonds in the molecule, and having a divalent group represented by the following general formula (G) and/or the following formula (H).

The radical generator and thermoplastic resin may be the same as the radical generator and thermoplastic resin used for the first embodiment, and they will not be explained again here.

The urethane(meth)acrylate of this embodiment has two or more (meth)acryloyl groups and two or more urethane bonds in the molecule, and a divalent group represented by the following general formula (G) and/or the following formula (H).

[Chemical Formula 9]

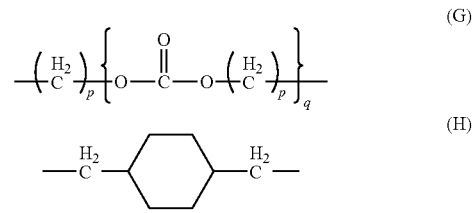

In formula (G), p represents an integer of 0-10 and q represents an integer of 1-20.

When the urethane(meth)acrylate has two or more groups represented by general formula (G) and/or formula (H) above in the molecule, they may be in any desired proportion.

The urethane(meth)acrylate of this embodiment is preferably one represented by the following general formula (I).

[Chemical Formula 10]

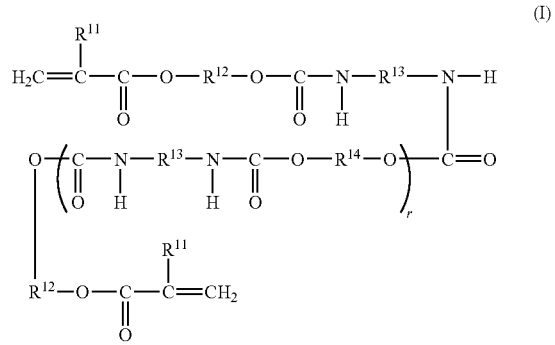

In formula (I), $R^{11}$ represents hydrogen or a methyl group, $R^{12}$ represents a C1-4 straight-chain or branched alkylene group, $R^{13}$ represents a divalent organic group with an aliphatic hydrocarbon group, $R^{14}$ represents a divalent organic group and r represents an integer of 1-60. The plurality of $R^{11}$, $R^{12}$ and $R^{13}$ groups in the molecule and $R^{14}$ where r is an integer of 2-60 may be the same or different.

From the viewpoint of improving the heat resistance, flow property and adhesion, $R^{14}$ preferably has a group represented by general formula (G) and/or formula (H) above, and more preferably it is a group represented by general formula (G) and/or formula (H) above.

In general formula (I), the number of repeating units r is more preferably 1-40 and even more preferably 3-20. If r exceeds 40, the crosslink density will tend to be reduced and the connection reliability of the adhesive composition will tend to be lower.

The weight-average molecular weight of the urethane(meth)acrylate of this embodiment is not particularly restricted but is preferably 1000-50,000 and more preferably 5000-30,000. If the weight-average molecular weight is less than 1000, the adhesive force of the adhesive composition will tend to be reduced due to cure shrinkage. If the weight-average molecular weight exceeds 50,000, the crosslink density and connection reliability will tend to be reduced.

The urethane(meth)acrylate of this embodiment may employ starting materials for introduction of the groups represented by general formula (G) and/or formula (H) above, and the synthesis methods and materials used may be those described in detail for the first embodiment. The starting materials for introduction of groups represented by general formula (G) and formula (H) may be compounds having OH groups at both ends.

According to the invention, the 25° C. viscosity of the urethane(meth)acrylate is preferably 5.0 Pa·s or greater. If the viscosity is less than 5.0 Pa·s, the viscosity of the adhesive composition as a whole will be reduced, thus tending to impair the workability and repairability.

The mixing proportion of the urethane(meth)acrylate in the adhesive composition of the invention is preferably 10-250 parts by weight and more preferably 30-150 parts by weight with respect to 100 parts by weight of the thermoplastic resin. If the mixing proportion is below 10 parts by weight the adhesive composition will tend to have lower heat resistance after curing, while if it exceeds 250 parts by weight the film formability will tend to be poor when the adhesive composition is used to form a film.

The adhesive composition of the invention preferably further comprises a vinyl compound with one or more phosphoric acid groups in the molecule. The vinyl compound with one or more phosphoric acid groups in the molecule is not particularly restricted and may be any known compound, but preferred are those having (meth)acryloyloxy groups in the molecule. As examples of such vinyl compounds there may be mentioned compounds represented by the following general formulas (J), (K) and (L).

[Chemical Formula 11]

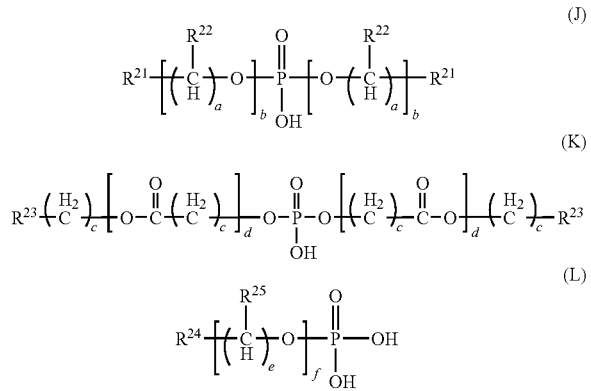

In formula (J), $R^{21}$ represents a (meth)acryloyloxy group, $R^{22}$ represents hydrogen or a methyl group and a and b each independently represent a integer of 1-8. In cases where more than one of each $R^{21}$, $R^{22}$, a and b are present, they may be either the same or different. In formula (K), $R^{23}$ represents a (meth)acryloyloxy group, and c and d each independently represent an integer of 1-8. In cases where more than one of each $R^{23}$, c and d are present, they may be either the same or different. In formula (L), $R^{24}$ represents a (meth)acryloyloxy group, $R^{25}$ represents hydrogen or a methyl group, and e and f each independently represent an integer of 1-8.

As specific examples of vinyl compounds with one or more phosphoric acid groups in the molecule there may be mentioned acid phosphooxyethyl methacrylate, acid phosphooxyethyl acrylate, acid phosphooxypropyl methacrylate, acid phosphooxypolyoxyethyleneglycol monomethacrylate, acid phosphooxypolyoxypropyleneglycol monomethacrylate, 2,2'-di(meth)acryloyloxydiethyl phosphate, EO (ethylene oxide)-modified phosphoric acid dimethacrylate, and the like.

The mixing proportion of the vinyl compound with one or more phosphoric acid groups in the molecule for the adhesive composition is preferably 0.1-15 parts by weight and more preferably 0.5-10 parts by weight with respect to 50 parts by weight of the thermoplastic resin. If the mixing proportion is less than 0.1 part by weight, it may be difficult to obtain high adhesive strength. If the mixing proportion exceeds 15 parts by weight, the cured adhesive composition will have inferior physical properties particularly in regard to adhesive strength, while the connection reliability will also be reduced.

The adhesive composition of the invention also preferably contains conductive particles. This can impart even better connection reliability to the cured adhesive composition. The conductive particles are not particularly restricted so long as they have sufficient conductivity to permit electrical connection. As examples of conductive particles there may be mentioned metallic particles containing Au, Ag, Ni, Cu, Co or alloys such as solder, and carbon. The conductive particles may also be in a multilayer form composed of particles with a core of non-conductive glass, ceramic, plastic or the like coated with a film comprising a conductive substance such as the aforementioned metals, or with particles comprising a conductive substance such as the aforementioned metals. The thickness of the coated film is preferably at least 10 nm in order to obtain more reliable conductivity.

When using such multilayered conductive particles or heat-fusible metallic particles as the conductive particles, the conductive particles will be deformable under heat and pressure. When using an adhesive composition containing such conductive particles for connection between circuits, therefore, the contact area between the circuit and the conductive particles will be increased, allowing variations in thickness between electrodes to be absorbed, and this is preferred from the standpoint of reliability.

Also, fine particles obtained by further coating the surfaces of conductive particles with a resin film can provide additional inhibition against shorting due to contact between the fine particles. Because insulation between electrode/circuit insulation can be improved, therefore, these may be added to the adhesive composition either alone or in admixture with conductive particles.

The mean particle size of the conductive particles is preferably 1-18 μm from the viewpoint of obtaining excellent dispersibility and conductivity. The content of the conductive particles in the adhesive composition is preferably 0.1-30 vol %, more preferably 0.1-20 vol % and even more preferably 0.1-10 vol %. If the conductive particle content is less than 0.1 part by volume the cured adhesive composition will tend to have inferior conductivity, while if it is greater than 30 parts by volume, using the adhesive composition for connection between the circuits will render connections between the insulated circuits more prone to shorting. For the same reason, the conductive particle content is also preferably 0.5-30 parts by weight with respect to 100 parts by weight of the thermoplastic resin.

The conductive particle content is determined based on the volume of each component in the adhesive composition before curing at 23° C. The volume of each component may be the volume converted from mass based on the specific gravity. The volume may also be calculated as the increased volume resulting after loading the components into a vessel containing a suitable solvent (water, alcohol, etc.) that sufficiently wets the components, without dissolving or swelling the components in a graduated cylinder or the like.

The adhesive composition of the invention may also be used with appropriately added adhesion aids such as coupling agents (alkoxysilane derivatives or silazane derivatives), adhesion enhancers, leveling agents and the like. Specifically, compounds represented by the following general formula (M) are preferred, and compounds represented by the following general formula (N) are more preferred.

[Chemical Formula 12]

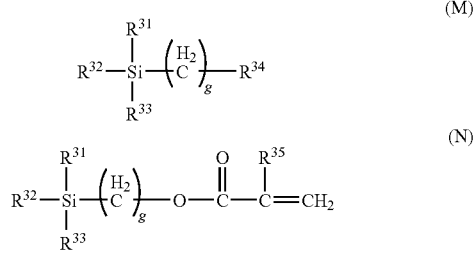

In formulas (M) and (N), $R^{31}$, $R^{32}$ and $R^{33}$ each independently represent hydrogen, C1-5 alkyl, C1-5 alkoxy, C1-5 alkoxycarbonyl or aryl, $R^{34}$ represents (meth)acryloyl, vinyl, isocyanato, imidazole, mercapto, amino, methylamino, dimethylamino, benzylamino, phenylamino, cyclohexylamino, morpholino, piperazino, ureido or glycidyl, $R^{35}$ represents hydrogen or methyl, and g is an integer of 1-10.

Preferred compounds represented by general formula (N) from the standpoint of high adhesion and electrical reliability are compounds wherein $R^{31}$ is C1-5 alkyl or aryl, $R^{32}$ and $R^{33}$ each independently represent a C2-3 alkoxy group and g is 2-4.

These compounds may be used alone or in combinations of two or more.

The adhesive composition of the invention may also contain a radical polymerizing compound other than the aforementioned urethane(meth)acrylate. Such radical polymerizing compounds are not particularly restricted so long as they are radical polymerizing, such as styrene derivatives or maleimide derivatives.

As examples of radical polymerizing compounds there may be mentioned oligomers such as epoxy(meth)acrylate oligomers, polyether(meth)acrylate oligomers and polyester (meth)acrylate oligomers, and polyfunctional (meth)acrylate compounds such as trimethylolpropane tri(meth)acrylate, polyethyleneglycol di(meth)acrylate, polyalkyleneglycol di(meth)acrylate, dicyclopentenyl(meth)acrylate, dicyclopentenyloxyethyl(meth)acrylate, neopentylglycol di(meth)acrylate, dipentaerythritol hexa(meth)acrylate, isocyanuric acid-modified bifunctional (meth)acrylates and isocyanuric acid-modified trifunctional (meth)acrylates.

These compounds may be used alone or in combinations of two or more.

For improved flow properties, the adhesive composition of the invention may be combined with a monofunctional (meth)acrylate compound, in addition to the compounds mentioned above. As examples of monofunctional (meth)acrylate compounds there may be mentioned pentaerythritol(meth)acrylate, 2-cyanoethyl(meth)acrylate, cyclohexyl(meth)acrylate, dicyclopentenyl(meth)acrylate, dicyclopentenyloxyethyl (meth)acrylate, 2-(2-ethoxyethoxy)ethyl(meth)acrylate, 2-ethoxyethyl(meth)acrylate, 2-ethylhexyl(meth)acrylate, n-hexyl(meth)acrylate, 2-hydroxyethyl(meth)acrylate, hydroxypropyl(meth)acrylate, isobornyl(meth)acrylate, isodecyl(meth)acrylate, isooctyl(meth)acrylate, n-lauryl(meth)acrylate, 2-methoxyethyl(meth)acrylate, 2-phenoxyethyl (meth)acrylate, tetrahydrofurfuryl(meth)acrylate, 2-(meth) acryloyloxyethyl phosphate, N,N-dimethylaminoethyl (meth)acrylate, N,N-dimethylaminoethyl(meth)acrylate, N,N-dimethylaminopropyl(meth)acrylate and (meth)acryloylmorpholine.

These compounds may also be used alone or in combinations of two or more.

For the purpose of improving the crosslinking rate, the adhesive composition of the invention may include appropriately added compounds with functional groups that polymerize by active radicals such as allyl, maleimide and vinyl groups, in addition to the aforementioned urethane(meth) acrylate or compound with other (meth)acryloyl groups. As specific examples of such compounds there may be mentioned N-vinylimidazole, N-vinylpyridine, N-vinylpyrrolidone, N-vinylformamide, N-vinylcaprolactam, 4,4'-vinylidenebis(N,N-dimethylaniline), N-vinylacetamide, N,N-dimethylacrylamide, N-isopropylacrylamide, N,N-diethylacrylamide and acrylamide.

These compounds may be used alone or in combinations of two or more.

The adhesive composition of the invention may further comprise a rubber component for the purpose of enhancing the stress relaxation and adhesion. As examples of rubber components there may be mentioned polyisoprene, polybutadiene, carboxyl-terminated polybutadiene, hydroxy-terminated polybutadiene, 1,2-polybutadiene, carboxyl-terminated 1,2-polybutadiene, hydroxy-terminated 1,2-polybutadiene, acrylic rubber, styrene-butadiene rubber, hydroxy-terminated styrene-butadiene rubber, acrylonitrile-butadiene rubber, acrylonitrile-butadiene rubber having carboxyl, hydroxyl, (meth)acryloyl or morpholine groups at the polymer ends, carboxylated nitrile rubber, hydroxy-terminated poly(oxypropylene), alkoxysilyl-terminated poly(oxypropylene), poly(oxytetramethylene)glycol, polyolefin glycols, poly-ε-caprolactone, and the like.

Preferred among the aforementioned rubber components from the viewpoint of improving adhesion are rubber components having high polar cyano or carboxyl groups on side chains or the ends, while liquid rubber is preferred from the viewpoint of improving the flow property. As examples of such rubber components there may be mentioned liquid acrylonitrile-butadiene rubber, liquid acrylonitrile-butadiene rubber having carboxyl, hydroxyl, (meth)acryloyl or morpholine groups at the polymer ends, and liquid carboxylated nitrile rubber. These rubber components preferably contain 10-60 wt % of acrylonitrile-derived polar groups.

The rubber components may be used alone or in combinations of two or more.

The adhesive composition of the invention can be given improved storage stability with appropriate addition of additives such as polymerization inhibitors, typified by t-butylpyrocatechol, t-butylphenol, p-methoxyphenol and the like.

Stabilizers may also be added to the adhesive composition of the invention for curing speed control and superior storage stability. Such stabilizers are not particularly restricted and may be any known stabilizers. Preferred among the known stabilizers are, for example, quinone derivatives such as benzoquinone and hydroquinone, phenol derivatives such as 4-methoxyphenol and 4-t-butylcatechol, aminoxyl derivatives such as 2,2,6,6-tetramethylpiperidine-1-oxyl and 4-hydroxy-2,2,6,6-tetramethylpiperidine-1-oxyl, and hindered amine derivatives such as tetramethylpiperidyl methacrylate.

The amount of stabilizer added to the adhesive composition is preferably 0.01-30 parts by weight and more preferably 0.05-10 parts by weight with respect to 100 parts by weight of the thermoplastic resin. If the amount of stabilizer added is less than 0.01 part by weight the effect of addition will tend to be reduced, while if it is greater than 30 parts by weight, compatibility with the other components will tend to be lower.

There may also be added to the adhesive composition of the invention components other than the additives mentioned above, such as fillers, softening agents, accelerators, age inhibitors, coloring agents and flame retardants.

The adhesive composition of the invention may also be a multiphase composition comprising two or more phases having Tg (glass transition temperatures) differing by at least 5° C. when cured.

The adhesive composition of the invention may also be a combination of one according to the first embodiment and one according to the second embodiment described above. For example, the adhesive composition of the invention may be a combination of a urethane(meth)acrylate according to the first embodiment and a urethane(meth)acrylate according to the second embodiment.

An adhesive of the invention may be used in paste form if it is a liquid at ordinary temperature (25° C.). If it is a solid at room temperature (25° C.), it may be heated for use, or formed into a paste using a solvent. There are no particular restrictions on the solvent used so long as it can thoroughly dissolve the adhesive components without reacting with any of the components in the adhesive composition. Such solvents having boiling points of 50-150° C. at ordinary pressure are preferred. If the boiling point is below 50° C., volatilization will tend to occur while standing at room temperature, thus limiting use in open systems. If the boiling point is higher than 150° C., volatilization of the solvent will be hampered, tending to adversely affect the reliability after bonding.

The adhesive composition of the invention may also be used after its shaping into a film. The method of forming a film of the adhesive composition (adhesive film) may be the following, for example. First, a solution obtained by adding a solvent as necessary to the adhesive composition is coated onto a releasable base such as a fluorine resin film, polyethylene terephthalate film or release sheet to form a coated film. Next, the solvent is removed to convert the coated film to a solid or semi-solid state and obtain an adhesive film. Alternatively, the solution may be impregnated into a base material such as a nonwoven fabric and placed over a releasable base, and the solvent removed to obtain an adhesive film. Using the adhesive composition as a film can provide further advantages from the viewpoint of manageability.

The adhesive composition of the invention may also be directly coated onto an adherend or placed on an adherend as an adhesive film, and then subjected to heat and pressure for bonding onto the adherend. The heating temperature is not particularly restricted but is preferably 100-250° C. The pressure is not particularly restricted so long as it is in a range that does not damage the adherend, but normally a range of 0.1-10 MPa is preferred. The heat and pressure are preferably applied for 0.5-120 seconds, and bonding can be achieved even with heat and pressure at 140-200° C., 3 MPa for 10 seconds. After connection, the adhesive composition may be subjected to post-curing. The connection may also be accomplished using, instead of heat and pressure, some energy other than heat, such as light, ultrasonic waves or electromagnetic waves.

The adhesive of the invention may be used as an adhesive for adherends with different thermal expansion coefficients. Specifically, it may be used as a circuit-connecting material such as an anisotropic conductive adhesive, silver paste, silver film or the like, or as a semiconductor element adhesive material such as a CSP elastomer, CSP underfill material, LOC tape or the like.

When the adhesive composition is molded into a film to produce an adhesive film and temporarily anchored onto a flexible wiring board, the temporary anchoring strength on the flexible wiring board is preferably 50 gf/cm-150 gf/cm. A temporary anchoring strength of greater than 150 gf/cm will be excessive pressure-sensitive adhesion, tending to hamper removal after attachment of flexible wiring boards onto the adhesive film (circuit connection adhesive) and lower the repairability. On the other hand, a temporary anchoring strength of less than 50 gf/cm will be insufficient pressure-sensitive adhesion, tending to result in flaking of the flexible wiring board from the adhesive film. When the molecular structure of the urethane(meth)acrylate does not include an ether structure, the pliability and adhesion of the cured adhesive will be insufficient, thus significantly lowering the connection reliability.

The temporary anchoring strength onto flexible wiring boards is measured in the following manner. First, a 15 μm adhesive film (circuit-connecting material) with a thickness of 15 μm is temporarily contacted bonded onto a PWB (printed wiring board) or a circuit-formed glass substrate, under conditions of 80° C., 1 MPa, 3 seconds. The flexible wiring board is then contact bonded onto the adhesive film under conditions of 23° C., 0.5 MPa, 5 seconds. The flexible wiring board is released from the adhesive film under conditions with a temperature of 23±3° C., a pull direction of 90° and a pull speed of 50 mm/min. The flexible wiring board and circuited-formed glass substrate had the following dimensions.

Flexible wiring board: 75 μm polyimide film, ½ Oz (ounces), copper foil tin plating, 0.2 mm pitch, electrode width/electrode spacing=1/1.

Glass substrate: 15-20Ω/□, total copper surface electrode by sputtering, 1.1 mm thickness.

The circuit member connection method of the invention will now be explained using a preferred mode. FIG. 1 is a simplified cross-sectional view showing an embodiment of a circuit member connection structure according to the invention. As shown in FIG. 1, the circuit member connection structure of this embodiment is provided with a first circuit member 20 and second circuit member 30 which face each other, and a circuit-connecting member 10 is provided between the first circuit member 20 and second circuit member 30 and connects them.

The first circuit member 20 is provided with a circuit board (first circuit board) 21 and a circuit electrode (first circuit electrode) 22 formed on the main surface 21a of the circuit board 21. An insulating layer (not shown) may also be formed on the main surface 21a of the circuit board 21.

The second circuit member 30 is provided with a circuit board (second circuit board) 31 and a circuit electrode (second circuit electrode) 32 formed on the main surface 31a of the circuit board 31. An insulating layer (not shown) may also be formed on the main surface 31a of the circuit board 31. The circuit boards 21, 31 may be made of inorganic materials such as semiconductors, glass or ceramics, organic substances such as polyimides, polycarbonates, polyesters or polyethersulfones, or compound materials composed of such inorganic or organic substances (for example, glass/polyepoxy resin).

The first and second circuit members 20, 30 are not particularly restricted so long as electrodes requiring electrical connection are formed thereon. Specifically, there may be mentioned glass substrates or plastic substrates, printed circuit boards, ceramic wiring boards, flexible wiring boards and the like on which electrodes are formed by ITO for use in liquid crystal display devices, and they may also be used in combination as necessary.

The circuit-connecting member 10 comprises an insulating substance 11 and conductive particles 7. The conductive particles 7 are situated not only between the facing circuit electrode 22 and circuit electrode 32, but also between the main surfaces 21a, 31a. In the circuit member connection structure, the circuit electrodes 22, 32 are electrically connected through the conductive particles 7. That is, the conductive particles 7 are in direct contact with both of the circuit electrodes 22, 32.

The conductive particles 7 correspond to the conductive particles, which may be present in the adhesive composition of the invention as described above.

In this circuit member connection structure, the circuit electrode 22 and circuit electrode 32 which are facing each other are electrically connected through the conductive particles 7 as mentioned above. Connection resistance between the circuit electrodes 22, 32 can therefore be sufficiently reduced. As a result it is possible to achieve a smooth flow of current between the circuit electrodes 22, 32, thereby allowing the function of the circuit to be satisfactorily exhibited. When the circuit-connecting member 10 does not contain conductive particles 7, the circuit electrode 22 and circuit electrode 32 come into direct contact to form an electrical connection.

As explained below, the circuit-connecting member 10 is composed of the cured product of a circuit-connecting material containing the adhesive composition. Thus, even if the circuit boards 21, 31 and the circuit electrodes 22, 32 are composed of different materials, the adhesive strength of the circuit-connecting member 10 on the circuit member 20 or 30 will be sufficiently high. Adequately high adhesive strength will also be maintained for prolonged periods in a circuit member connection structure. It is therefore possible to prevent changes in the distance between the circuit electrodes 22, 32 with time, so that long-term reliability of the electrical characteristics between the circuit electrodes 22, 32 can be increased.

A process for production of a circuit member connection structure will now be explained.

First, the first circuit member 20 and circuit-connecting material film 40 described above are prepared (see FIG. 2(a)). The circuit-connecting material film 40 is obtained by forming the circuit-connecting material into a film, and it may also be laminated with a releasable support film. The circuit-connecting material film 40 is usually pulled out from being wound on a winding core, and cut to the necessary length. Since the circuit-connecting material film 40 in this case includes an adhesive composition of the invention, lamination with a support film and pulling out from a wound state will not result in unsatisfactory back-side transfer of the circuit-connecting material film 40 onto the support film. The poor adhesion and poor connection that occurs with back-side transfer onto support films are therefore prevented.

The circuit-connecting material comprises an adhesive composition 5 containing conductive particles 7. The adhesive composition 5 used contains the structural materials described above. Even if the circuit-connecting material does not contain conductive particles 7, the circuit-connecting material can be used as an insulating adhesive for anisotropic conductive bonding, in which case it is often referred to as NCP (Non-Conductive Paste). When the circuit-connecting material contains conductive particles 7, the circuit-connecting material may be referred to as an ACP (Anisotropic Conductive Paste).

The content of the conductive particles 7 in the circuit-connecting material is preferably 0.1-30 vol % and more preferably 1.0-20 vol % with respect to the total of the circuit-connecting material. With a content of less than 0.1 vol %, it may be difficult to achieve satisfactory conduction. At greater than 30 vol %, on the other hand, shorting may occur with adjacent circuits.

The thickness of the circuit-connecting material film 40 is preferably 5-50 μm. If the thickness of the circuit-connecting material film 40 is less than 5 μm, the circuit-connecting material may not sufficiently fill the space between the circuit electrodes 22, 32. On the other hand, a thickness exceeding 50 μm may make it difficult to sufficiently remove the adhesive composition between the circuit electrodes 22, 32, often to an extent hampering conduction between the circuit electrodes 22, 32.

The circuit-connecting material film 40 is placed over the side of the first circuit member 20 on which the circuit electrode 22 has been formed. When the circuit-connecting material film 40 is attached to a support (not shown), it is placed on the first circuit member 20 with the circuit-connecting material film 40 side facing the first circuit member 20. The circuit-connecting material film 40 is a film and is therefore easy to handle. Since it is therefore easy to situate the circuit-connecting material film 40 between the first circuit member 20 and second circuit member 30, connection between the first circuit member 20 and second circuit member 30 is facilitated.

Figure 2:
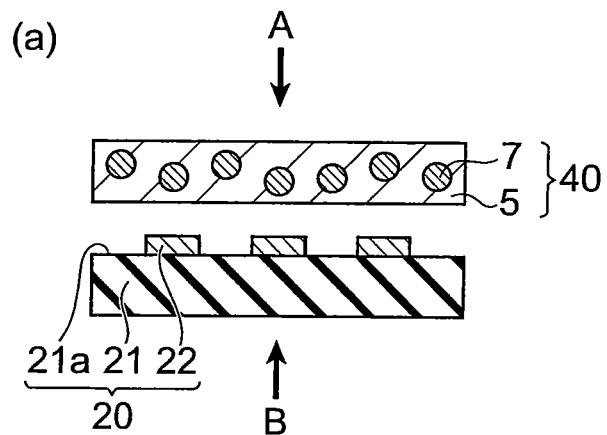
FIG. 2 is a flow chart for connection of a circuit member according to the invention.
Figure 2:
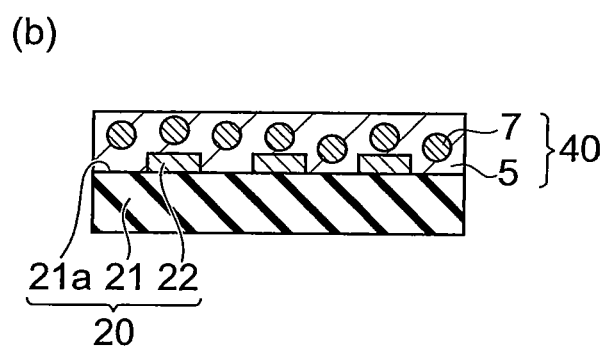
Figure 2:
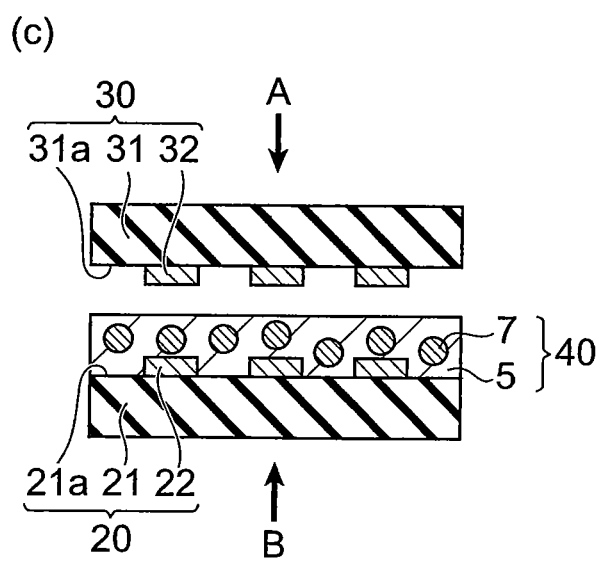

The circuit-connecting material film 40 is pressed in the directions of the arrows A and B in FIG. 2(a) to temporarily anchor (temporarily connect) the circuit-connecting material film 40 to the first circuit member 20 (see FIG. 2(b)). The pressing may be accompanied by heating. However, the heating must be at a temperature that does not cure the adhesive composition in the circuit-connecting material film 40. Since the circuit-connecting material film 40 comprises an adhesive composition of the invention, satisfactory temporary anchoring is accomplished even when the first circuit member 20 is a flexible wiring board.

When the circuit-connecting material film 40 is laminated with a support film (not shown), the support film is released. In this case, the circuit-connecting material film 40, which comprises an adhesive composition of the invention, allows the support film to be satisfactorily released.

The circuit-connecting material film 40 is then irradiated with active light rays. Next, as shown in FIG. 2(c), the second circuit member 30 is placed on the circuit-connecting material film 40 with the second circuit electrode facing the first circuit member 20. When the circuit-connecting material film 40 is attached to a support (not shown), the second circuit member 30 is placed on the circuit-connecting material film 40 after releasing the support.

The circuit-connecting material film 40 is pressed, while heating, via the first and second circuit members 20, 30 in the directions of the arrows A and B in FIG. 2(c). The heating is carried out at a temperature that allows curing of the adhesive composition of the invention. The circuit-connecting material film 40 is thus cured, forming the main connection to obtain a circuit member connection structure as shown in FIG. 1. The connection conditions are appropriately selected according to the purpose of use and according to the adhesive composition and circuit member.

For example, the heating temperature may be 50-250° C. and preferably 50-190° C., while the pressure will generally be 0.1-10 MPa, and the time required for heating and pressing (connection time) is 1 second-10 minutes and preferably 1-10 seconds.

As mentioned above, fabrication of a circuit member connection structure allows the conductive particles 7 to contact with both of the facing circuit electrodes 22, 32 in the circuit member connection structure, thus adequately reducing connection resistance between the circuit electrodes 22, 32.

Heating of the circuit-connecting material film 40 cures the adhesive composition 5 to form an insulating material 11 with a sufficiently small distance between the circuit electrode 22 and circuit electrode 32, so that the first circuit member 20 and second circuit member 30 are firmly bonded via the circuit-connecting member 10. That is, since the circuit-connecting member 10 in the obtained circuit member connection structure is constructed of the cured circuit-connecting material comprising the adhesive composition, the adhesive strength of the circuit-connecting member 10 for the circuit member 20 or 30 is sufficiently high, the adhesive strength being sufficiently high particularly under high-temperature, high-humidity conditions. Adequately high adhesive strength will also be maintained for prolonged periods in the circuit member connection structure. It is therefore possible to prevent changes in the distance between the circuit electrodes 22, 32 of the obtained circuit member connection structure with time, so that long-term reliability of the electrical characteristics between the circuit electrodes 22, 32 can be increased.

Figure 3:
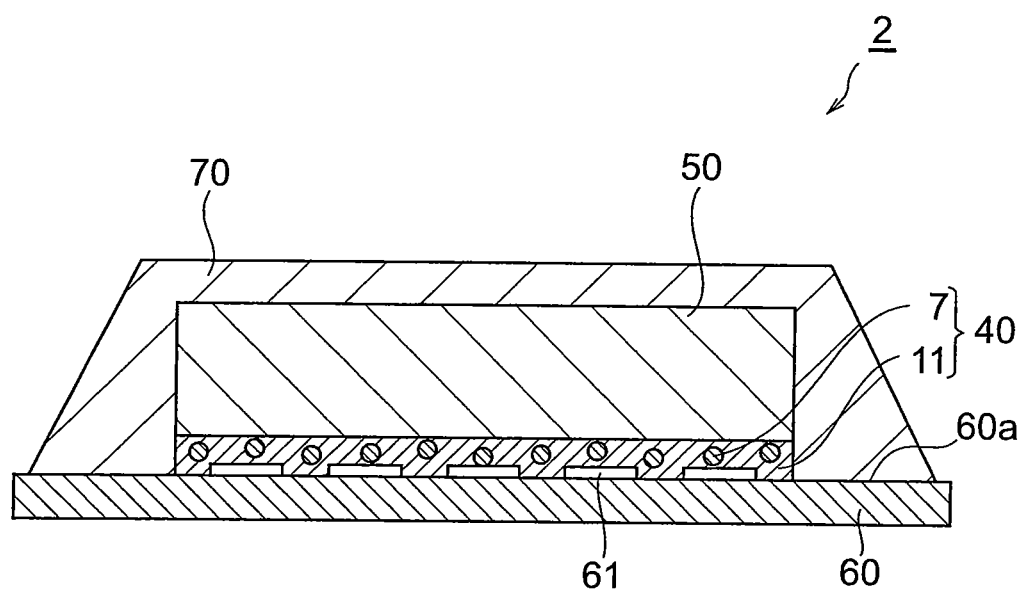
FIG. 3 is a simplified cross-sectional view showing an embodiment of a semiconductor device according to the invention.

A preferred embodiment of a semiconductor device of the invention will now be explained. FIG. 3 is a simplified cross-sectional view showing an embodiment of a semiconductor device according to the invention. As shown in FIG. 3, the semiconductor device 2 of this embodiment comprises a semiconductor element 50 and a substrate 60 serving as the support member for the semiconductor, and a semiconductor element connecting member 40 is provided between the semiconductor element 50 and the substrate 60 for electrical connection between them. The semiconductor element connecting member 40 is laminated on the main surface 60a of the semiconductor 60, while the semiconductor element 50 is further laminated on the semiconductor element connecting member 40.

The substrate 60 is provided with a circuit pattern 61, and the circuit pattern 61 is electrically connected with the semiconductor element 50, either directly or via the semiconductor connecting member 40, on the main surface 60a of the substrate 60. These are sealed with a sealing material 70 to form the semiconductor device 2.

There are no particular restrictions on the material of the semiconductor element 50, and there may be used Group 4 semiconductor elements such as silicon or germanium, Group III-V compound semiconductor elements such as GaAs, InP, GaP, InGaAs, InGaAsP, AlGaAs, InAs, GaInP, AlInP, AlGaInP, GaNAs, GaNP, GaInNAs, GaInNP, GaSb, InSb, GaN, AlN, InGaN and InNAsP, Group II-VI compound semiconductor elements such as HgTe, HgCdTe, CdMnTe, CdS, CdSe, MgSe, MgS, ZnSe and ZeTe, and CuInSe (CIS) or the like.

The semiconductor element connecting member 40 includes an insulating material 11 and conductive particles 7. The conductive particles 7 are situated not only between the semiconductor element 50 and circuit pattern 61, but also between the semiconductor element 50 and the main surface 60a. In the semiconductor device 2 of this embodiment, the semiconductor element 50 and circuit pattern 61 are electrically connected via the conductive particles 7. Connection resistance between the semiconductor element 50 and circuit pattern 61 is therefore adequately reduced. Consequently, smooth current flow can be achieved between the semiconductor element 50 and circuit pattern 61, to allow the function of the semiconductor to be adequately exhibited. In addition, adding the conductive particles 7 in the proportion mentioned above can create electrical connection anisotropy.

When the semiconductor element connecting member 40 lacks the conductive particles 7, electrical connection is accomplished by direct contact or sufficient proximity between the semiconductor element 50 and circuit pattern 61 for the desired volume of current to flow.

Since the semiconductor element connecting member 40 is composed of the cured adhesive composition containing the adhesive composition described above, the adhesive strength of the semiconductor element connecting member 40 for the semiconductor element 50 and substrate 60 is satisfactorily high, and the condition can be maintained for prolonged periods. Consequently, long-term reliability of electrical characteristics can be increased between the semiconductor element 50 and substrate 60. Although a circuit-connecting material film 40 was used for fabrication of the circuit member connection structure in the embodiment described above, a circuit-connecting material may be used instead of the circuit-connecting material film 40. In this case as well, dissolving the circuit-connecting material in a solvent and coating and drying the solution on either or both the first circuit member 20 and second circuit member 30 can form a circuit-connecting material between the first and second circuit members 20, 30.

Another conductive material may also be used instead of conductive particles 7. As other conductive materials there may be mentioned particulate or staple fiber carbon, or metal wires such as Au-plated Ni wire.

EXAMPLES

The invention will now be explained in detail using examples, with the understanding that the invention is in no way limited to these examples.

(Synthesis of Urethane Acrylate UA-A)

After introducing air gas into a reactor equipped with a stirrer, thermometer, condenser tube and air gas inlet tube, there were charged 238 parts by weight (2.05 mol) of 2-hydroxyethyl acrylate, 118 parts by weight (1 mol) of 3-methyl-1,5-pentanediol (product of Wako Pure Chemical Industries, Ltd.), 850 parts by weight (1 mol) of polytetramethylene ether glycol with a weight-average molecular weight of 850 (trade name: PTG850 by Hodogaya Chemical Co., Ltd.), 0.18 part by weight of hydroquinonemonomethyl ether and 1.81 parts by weight of dibutyltin dilaurate. Next, 630 parts by weight (3 mol) of 2,4,4-trimethylhexamethylene diisocyanate was added dropwise to the reactor uniformly over a period of 3 hours while heating the interior of the reactor to 70-75° C., for reaction. Reaction was continued for approximately 15 hours after completion of the dropwise addition, and then the reaction was suspended upon confirming disappearance of isocyanate based on IR measurement. This yielded urethane acrylate UA-A with a weight-average molecular weight of 4200.

(Synthesis of Urethane Acrylate UA-B)

After introducing air gas into a reactor equipped with a stirrer, thermometer, condenser tube and air gas inlet tube, there were charged 238 parts by weight (2.05 mol) of 2-hydroxyethyl acrylate, 118 parts by weight (1 mol) of 3-methyl-1,5-pentanediol (product of Wako Pure Chemical Industries, Ltd.), 2000 parts by weight (1 mol) of polytetramethylene ether glycol with a weight-average molecular weight of 2000 (trade name: PTG2000 by Hodogaya Chemical Co., Ltd.), 0.53 part by weight of hydroquinonemonomethyl ether and 5.53 parts by weight of dibutyltin dilaurate. Next, 630 parts by weight (3 mol) of methyl-1,6-diisocyanatehexane was added dropwise to the reactor uniformly over a period of 3 hours while heating the interior of the reactor to 80-90° C., for reaction. Reaction was continued for approximately 15 hours after completion of the dropwise addition, and then the reaction was suspended upon confirming disappearance of isocyanate based on IR measurement. This yielded urethane acrylate UA-B with a weight-average molecular weight of 9800.

(Synthesis of Urethane Acrylate UA-C)

After introducing air gas into a reactor equipped with a stirrer, thermometer, condenser tube and air gas inlet tube, there were charged 238 parts by weight (2.05 mol) of 2-hydroxyethyl acrylate, 118 parts by weight (1 mol) of 2-methyl-2,4-pentanediol (product of Wako Pure Chemical Industries, Ltd.), 2000 parts by weight (1 mol) of polytetramethylene ether glycol with a weight-average molecular weight of 2000 (trade name: PTG2000 by Hodogaya Chemical Co., Ltd.), 0.53 part by weight of hydroquinonemonomethyl ether and 5.53 parts by weight of dibutyltin dilaurate. Next, 630 parts by weight (3 mol) of 2,4,4-trimethylhexamethylene diisocyanate was added dropwise to the reactor uniformly over a period of 3 hours while heating the interior of the reactor to 70-75° C., for reaction. Reaction was continued for approximately 15 hours after completion of the dropwise addition, and then the reaction was suspended upon confirming disappearance of isocyanate based on IR measurement. This yielded urethane acrylate UA-C with a weight-average molecular weight of 9200.

(Synthesis of Urethane Acrylate UA-D)

After introducing air gas into a reactor equipped with a stirrer, thermometer, condenser tube and air gas inlet tube, there were charged 238 parts by weight (2.05 mol) of 2-hydroxyethyl acrylate, 118 parts by weight (1 mol) of 3-methyl-1,5-pentanediol (product of Wako Pure Chemical Industries, Ltd.), 2000 parts by weight (1 mol) of polytetramethylene ether glycol with a weight-average molecular weight of 2000 (trade name: PTG2000 by Hodogaya Chemical Co., Ltd.), 0.64 part by weight of hydroquinonemonomethyl ether and 6.35 parts by weight of dibutyltin dilaurate. Next, 444 parts by weight (2 mol) of isophorone diisocyanate was added dropwise to the reactor uniformly over a period of 3 hours while heating the interior of the reactor to 80-90° C., for reaction. Reaction was continued for approximately 15 hours after completion of the dropwise addition, and then the reaction was suspended upon confirming disappearance of isocyanate based on IR measurement. This yielded urethane acrylate UA-D with a weight-average molecular weight of 11,500.

(Synthesis of Urethane Acrylate UA-E)

After introducing air gas into a reactor equipped with a stirrer, thermometer, condenser tube and air gas inlet tube, there were charged 238 parts by weight (2.05 mol) of 2-hydroxyethyl acrylate, 118 parts by weight (1 mol) of 3-methyl-1,5-pentanediol (product of Wako Pure Chemical Industries, Ltd.), 850 parts by weight (1 mol) of polytetramethylene ether glycol with a weight-average molecular weight of 850 (trade name: PTG850 by Hodogaya Chemical Co., Ltd.), 0.18 part by weight of hydroquinonemonomethyl ether and 1.81 parts by weight of dibutyltin dilaurate. Next, 630 parts by weight (3 mol) of 2,4,4-trimethylhexamethylene diisocyanate was added dropwise to the reactor uniformly over a period of 3 hours while heating the interior of the reactor to 60-65° C., for reaction. Reaction was continued for approximately 8 hours after completion of the dropwise addition, and then the reaction was suspended upon confirming disappearance of isocyanate based on IR measurement. This yielded urethane acrylate UA-E with a weight-average molecular weight of 2800.

(Synthesis of Urethane Acrylate UA-F)

After introducing air gas into a reactor equipped with a stirrer, thermometer, condenser tube and air gas inlet tube, there were charged 238 parts by weight (2.05 mol) of 2-hydroxyethyl acrylate, 4000 parts by weight (2 mol) of polytetramethylene ether glycol with a weight-average molecular weight of 2000 (trade name: PTG2000 by Hodogaya Chemical Co., Ltd.), 0.64 part by weight of hydroquinonemonomethyl ether and 6.35 parts by weight of dibutyltin dilaurate. Next, 444 parts by weight (2 mol) of isophorone diisocyanate was added dropwise to the reactor uniformly over a period of 3 hours while heating the interior of the reactor to 90-100° C., for reaction. Reaction was continued for approximately 18 hours after completion of the dropwise addition, and then the reaction was suspended upon confirming disappearance of isocyanate based on IR measurement. This yielded urethane acrylate UA-F with a weight-average molecular weight of 32,000.

Examples 1-4, Comparative Examples 1, 2

A thermoplastic phenoxy resin (PKHC, trade name of Union Carbide Corp., average molecular weight: 45,000) was dissolved in an amount of 40 g in 60 g of methyl ethyl ketone to prepare a solution with a solid content of 40 wt %. As radical polymerizing compounds there were prepared an isocyanuric acid EO-modified diacrylate (trade name: M-215 by Toagosei Co., Ltd.) and 2-(meth)acryloyloxyethyl phosphate (trade name: LIGHT ESTER P-2M by Kyoeisha Chemical Co., Ltd.), as urethane acrylates represented by general formula (A) there were prepared UA-A, UA-B, UA-C, UA-D, UA-E and UA-F synthesized in the manner described above, and as a radical generator (radical polymerization initiator) there was prepared a 50 wt % dioctyl phthalate (DOP) solution of t-hexylperoxy-2-ethyl hexanonate (trade name: PERCURE HO by NOF Corp.).

A nickel layer with a film thickness of 0.20 μm was formed on the surfaces of particles with a polystyrene core, and a gold layer with a film thickness of 0.02 μm was formed on the outside of the nickel layer to produce conductive particles with a mean particle size of 4 μm and a specific gravity of 2.5.

The prepared structural materials were combined in the solid weight proportions shown in Table 1, and the conductive particles prepared in the manner described above were dispersed therein at 1.5 vol % with respect to the adhesive component to obtain an adhesive composition. A coating device was used to coat the obtained adhesive composition onto a fluorine resin film with a thickness of 80 μm as a support film, and the coating was hot air dried at 70° C. for 10 minutes to obtain an adhesive film. The film thickness of the circuit-connecting material film on the support film was 15 μm.

TABLE 1

|  |  | Example 1 | Example 2 | Example 3 | Example 4 | Comp. Ex. 1 | Comp. Ex. 2 |
|---|---|---|---|---|---|---|---|
| Thermoplastic resin | Phenol resin | 50 | 50 | 50 | 50 | 50 | 50 |
| Radical polymerizing compound | M-215 | 25 | 25 | 25 | 25 | 25 | 25 |
|  | LIGHT ESTER P-2M | 5 | 5 | 5 | 5 | 5 | 5 |

TABLE 1-continued

|  |  | Example 1 | Example 2 | Example 3 | Example 4 | Comp. Ex. 1 | Comp. Ex. 2 |
|---|---|---|---|---|---|---|---|
| Urethane acrylate | UA-A | 20 | — | — | — | — | — |
|  | UA-B | — | 20 | — | — | — | — |
|  | UA-C | — | — | 20 | — | — | — |
|  | UA-D | — | — | — | 20 | — | — |
|  | UA-E | — | — | — | — | 20 | — |
|  | UA-F | — | — | — | — | — | 20 |
| Radical generator | PERCURE HO | 3 | 3 | 3 | 3 | 3 | 3 |

(Fabrication of Circuit Connection)

The obtained adhesive film was used for connection between a flexible wiring board (FPC) having 500 copper circuits, with a line width of 25 μm, a pitch of 50 μm and a thickness of 18 μm, and a glass substrate (thickness: 1.1 mm, surface resistance: 20Ω/□) having a 0.20 μm-thick indium oxide tin (ITO) thin-layer formed thereon, in the following manner. First, the adhesive film was situated on a glass substrate with an ITO thin-layer already formed on its surface (hereinafter referred to as "ITO-coated glass substrate"), so that the surface opposite the side with the support film was facing the surface of the ITO thin-layer of the ITO-coated glass substrate. Next, the adhesive film and ITO-coated glass substrate were pressed via the support film while heating at 70° C., 1 MPa for 3 seconds, for temporary connection of the adhesive film on the ITO-coated glass substrate. The support film was then released from the adhesive film for transfer of the adhesive film onto the ITO-coated glass substrate. Next, a flexible wiring board (FPC) with 600 tin-plated copper circuits, having a pitch of 50 μm and a thickness of 8 μm, was situated on the adhesive film. These were then pressed in the direction of lamination at 24° C., 0.5 MPa for 1 second to obtain a temporarily anchored laminate. The laminate was situated at a prescribed position in a thermocompression bonding apparatus (heated system: constant heating, product of Toray Engineering), and pressing was carried out in the direction of lamination while heating at 175° C., 3 MPa for 15 seconds. The ITO-coated glass substrate and flexible wiring board were thus connected via a circuit-connecting member across a width of 2 mm to fabricate a circuit connection structure.

(Measurement of Connection Resistance)

The resistance value between adjacent circuits of the circuit connection structure was measured with a multimeter, immediately after bonding and after holding for 120 hours in a high-temperature, high-humidity environment of 85° C., 85% RH. The results are shown in Table 2. The resistance value was represented as the average of 150 points of resistance between adjacent circuits (x+3σ; x=mean value, σ=standard deviation).

(Measurement of Adhesive Strength)

The adhesive strength between the flexible wiring board and the ITO-coated glass substrate in the circuit connection structure was measured by the 90° peel method according to JIS-Z0237. The measuring apparatus used for the adhesive strength was a TENSILON UTM-4 by Toyo Baldwin Co., Ltd. (peel rate: 50 mm/min, 25° C.). The results are shown in Table 2.

(Evaluation of Temporary Anchoring Force)

The temporary anchoring force on the flexible wiring board was measured in the manner described above. The results are shown in Table 2.

Example 5

There were prepared a semiconductor chip (3×10 mm, height: 0.5 mm, with 100 μm-square gold electrodes (bumps) protruding to a height of 20 μm on the four peripheral sides of the main surface) and a semiconductor mounting substrate fabricated from a 1 mm-thick glass/epoxy substrate having connection terminals corresponding to the bump positions (18 μm-thick circuits formed of copper foil). The surface of the circuit on the semiconductor mounting substrate was nickel/gold plated. The protruding electrodes of the semiconductor chip and the semiconductor mounting substrate were connected in the following manner using the adhesive film of Example 2 described above. The circuit side of the semiconductor mounting substrate was temporarily contact bonded at 80° C., 1 MPa for 3 seconds with an adhesive film that was laminated with a support film. After then releasing the support film, the protruding electrodes of the semiconductor chip were positioned with the semiconductor mounting substrate and thermocompression bonding was carried out for 20 seconds at a temperature and pressure of 180° C., 10 kgf/chip.

This accomplished electrical connection between the protruding electrodes of the semiconductor chip and the circuit of the semiconductor mounting substrate via the adhesive film. The electrodes of the semiconductor chip and the semiconductor mounting substrate were kept in this connected state by curing of the adhesive film by the thermocompression

TABLE 2

|  | Connection resistance (Ω) | | Adhesive strength (N/m) | | Temporary |
|---|---|---|---|---|---|
|  | Immediately after bonding | After 120 hours | Immediately after bonding | After 120 hours | anchoring force (gf/cm) |
| Example 1 | 1.9 | 2.3 | 1050 | 950 | 80 |
| Example 2 | 1.8 | 2.2 | 1120 | 1000 | 100 |
| Example 3 | 2.5 | 2.8 | 900 | 800 | 75 |
| Example 4 | 1.7 | 2.7 | 800 | 750 | 68 |
| Comp. Ex. 1 | 1.7 | 6.5 | 960 | 850 | 25 |
| Comp. Ex. 2 | 2.8 | 7.2 | 850 | 730 | 13 | bonding. The semiconductor device obtained in this manner by connecting the semiconductor chip and semiconductor mounting substrate was subjected to a thermal cycle test, repeating a cycle of (−55° C., 30 min)/(125° C., 30 min) The thermal cycle test was repeated for 1000 cycles, and then the connection resistance between the semiconductor chip protruding electrodes and the substrate circuit was measured. As a result, virtually no increase in connection resistance was observed, demonstrating that satisfactory connection reliability was exhibited.

As mentioned above, the adhesive compositions of Examples 1-4 according to the invention used for connection between circuits or the like provided sufficiently low connection resistance, and even after 120 hours of holding in a high-temperature, high-humidity tank there was virtually no change from the resistance immediately after connection. The adhesive strength was likewise satisfactory.

In contrast, the adhesive compositions of Comparative Examples 1 and 2, which employed urethane(meth)acrylates with a weight-average molecular weight of less than 3000 or greater than 30,000, either already had high connection resistance immediately after connection between the circuits, or had high connection resistance after 120 hours in the high-temperature, high-humidity tank. Also, because the temporary anchoring force was less than 50 gf/cm, the pressure-sensitive adhesive force was weak and the flexible wiring board readily peeled from the circuit-connecting adhesive.

The adhesive composition of the invention has a superior balance of properties, exhibiting a satisfactory transfer property and providing good temporary anchoring onto flexible circuit boards, while also having excellent storage stability and connection reliability.

(Synthesis of Urethane Acrylate UA-1)

After introducing air gas into a reactor equipped with a stirrer, thermometer, condenser tube and air gas inlet tube, there were charged 238 parts by weight (2.05 mol) of 2-hydroxyethyl acrylate, 860 parts by weight (1 mol) of poly(hexanemethylene carbonate)diol with a number-average molecular weight of 860 (Aldrich Co.), 144 parts by weight (1 mol) of 1,4-cyclohexanedimethanol, 0.19 part by weight of hydroquinonemonomethyl ether and 1.91 parts by weight of dibutyltin dilaurate. Next, 666 parts by weight (3 mol) of isophorone diisocyanate was added dropwise to the reactor uniformly over a period of 3 hours while heating the interior of the reactor to 70-75° C., for reaction. Reaction was continued for approximately 15 hours after completion of the dropwise addition, and then the reaction was suspended upon confirming disappearance of isocyanate based on IR measurement. This yielded urethane acrylate UA-1 with a weight-average molecular weight of 3700.

(Synthesis of Urethane Acrylate UA-2)

After introducing air gas into a reactor equipped with a stirrer, thermometer, condenser tube and air gas inlet tube, there were charged 238 parts by weight (2.05 mol) of 2-hydroxyethyl acrylate, 2000 parts by weight (1 mol) of poly(hexanemethylene carbonate)diol with a number-average molecular weight of 2000 (Aldrich Co.), 144 parts by weight (1 mol) of 1,4-cyclohexanedimethanol, 0.30 part by weight of hydroquinonemonomethyl ether and 3.05 parts by weight of dibutyltin dilaurate. Next, 666 parts by weight (3 mol) of isophorone diisocyanate was added dropwise to the reactor uniformly over a period of 3 hours while heating the interior of the reactor to 70-75° C., for reaction. Reaction was continued for approximately 18 hours after completion of the dropwise addition, and then the reaction was suspended upon confirming disappearance of isocyanate based on IR measurement. This yielded urethane acrylate UA-2 with a weight-average molecular weight of 5400.

(Synthesis of Urethane Acrylate UA-3)

After introducing air gas into a reactor equipped with a stirrer, thermometer, condenser tube and air gas inlet tube, there were charged 238 parts by weight (2.05 mol) of 2-hydroxyethyl acrylate, 4000 parts by weight (2 mol) of poly(hexanemethylene carbonate)diol with a number-average molecular weight of 2000 (Aldrich Co.), 0.49 part by weight of hydroquinonemonomethyl ether and 4.90 parts by weight of dibutyltin dilaurate. Next, 666 parts by weight (3 mol) of isophorone diisocyanate was added dropwise to the reactor uniformly over a period of 3 hours while heating the interior of the reactor to 70-75° C., for reaction. Reaction was continued for approximately 15 hours after completion of the dropwise addition, and then the reaction was suspended upon confirming disappearance of isocyanate based on IR measurement. This yielded urethane acrylate UA-3 with a weight-average molecular weight of 6800.

(Synthesis of Urethane Acrylate UA-4)

After introducing air gas into a reactor equipped with a stirrer, thermometer, condenser tube and air gas inlet tube, there were charged 238 parts by weight (2.05 mol) of 2-hydroxyethyl acrylate, 1800 parts by weight (2 mol) of poly(ethylene glycol)diol with a number-average molecular weight of 900 (Aldrich Co.), 0.27 part by weight of hydroquinonemonomethyl ether and 2.70 parts by weight of dibutyltin dilaurate. Next, 666 parts by weight (3 mol) of isophorone diisocyanate was added dropwise to the reactor uniformly over a period of 3 hours while heating the interior of the reactor to 70-75° C., for reaction. Reaction was continued for approximately 15 hours after completion of the dropwise addition, and then the reaction was suspended upon confirming disappearance of isocyanate based on IR measurement. This yielded urethane acrylate UA-4 with a weight-average molecular weight of 4800.

(Synthesis of Urethane Acrylate UA-5)

After introducing air gas into a reactor equipped with a stirrer, thermometer, condenser tube and air gas inlet tube, there were charged 238 parts by weight (2.05 mol) of 2-hydroxyethyl acrylate, 0.16 part by weight of hydroquinonemonomethyl ether and 1.58 parts by weight of dibutyltin dilaurate. Next, 444 parts by weight (2 mol) of isophorone diisocyanate was added dropwise to the reactor uniformly over a period of 3 hours while heating the interior of the reactor to 70-75° C., for reaction. Next, 900 parts by weight (1 mol) of poly(ethylene glycol)diol with a number-average molecular weight of 900 (Aldrich Co.) was added dropwise to the reactor over a period of 3 hours for reaction. Reaction was continued for approximately 15 hours after completion of the dropwise addition, and urethane acrylate UA-5 was obtained upon confirming disappearance of isocyanate based on IR measurement.

Examples 6-8, Comparative Examples 3, 4

A phenoxy resin and a urethane resin were used as thermoplastic resins. A phenoxy resin (PKHC, trade name of Union Carbide Corp., average molecular weight: 45,000) was dissolved in an amount of 40 g in 60 g of methyl ethyl ketone to prepare a solution with a solid content of 40 wt %. The urethane resin was synthesized in the following manner. First, 450 parts by weight of polybutylene adipate diol with an average molecular weight of 2000, 450 parts by weight of polyoxytetramethylene glycol with an average molecular weight of 2000 and 100 parts by weight of 1,4-butylene glycol were uniformly combined in 4000 parts by weight of methyl ethyl ketone. Next, 390 parts by weight of diphenylmethane diisocyanate was added and reaction was carried out at 70° C. to obtain a urethane resin with a weight-average molecular weight of 350,000.

As a radical polymerizing compound there was prepared 2-(meth)acryloyloxyethyl phosphate (trade name: LIGHT ESTER P-2M by Kyoeisha Chemical Co., Ltd.), as urethane (meth)acrylates having divalent molecules represented by general formula (G) and/or formula (H) above in the molecule there were prepared UA-1, UA-2, UA-3, UA-4 and UA-5 synthesized in the manner described above, and as a radical generator there was prepared t-hexylperoxy-2-ethyl hexanonate (trade name: PERHEXYL 0 by NOF Corp.).

A nickel layer with a film thickness of 0.20 μm was formed on the surfaces of particles with a polystyrene core, and a gold layer with a film thickness of 0.02 μm was formed on the outside of the nickel layer to produce conductive particles with a mean particle size of 4 μm and a specific gravity of 2.5.

The prepared structural materials were combined in the solid weight proportions shown in Table 3, and the conductive particles prepared in the manner described above were dispersed therein at 1.5 vol % with respect to the adhesive component to obtain an adhesive composition. A coating device was used to coat the obtained adhesive composition onto a fluorine resin film with a thickness of 80 μm as a support film, and the coating was hot air dried at 70° C. for 10 minutes to obtain an adhesive film. The film thickness of the circuit-connecting material film on the support film was 15 μm.

TABLE 3

|  |  | Example 6 | Example 7 | Example 8 | Comp. Ex. 3 | Comp. Ex. 4 |
|---|---|---|---|---|---|---|
| Thermoplastic resin | Phenol resin | 35 | 35 | 35 | 35 | 35 |
|  | Urethane resin | 15 | 15 | 15 | 15 | 15 |
| Radical polymerizing compound | LIGHT ESTER P-2M | 5 | 5 | 5 | 5 | 5 |
| Urethane acrylate | UA-1 | 45 | — | — | — | — |
|  | UA-2 | — | 45 | — | — | — |
|  | UA-3 | — | — | 45 | — | — |
|  | UA-4 | — | — | — | 45 | — |
|  | UA-5 | — | — | — | — | 45 |
| Radical generator | PERHEXYL O | 3 | 3 | 3 | 3 | 3 |

(Fabrication of Circuit Connection)

The obtained adhesive film was used for connection between a flexible wiring board (FPC) having 500 copper circuits, with a line width of 25 μm, a pitch of 50 μm and a thickness of 8 μm, and a glass substrate (thickness: 1.1 mm, surface resistance: 20Ω/□) having a 0.20 μm-thick indium oxide tin (ITO) thin-layer formed thereon, in the following manner. First, the adhesive film was situated on a glass substrate with an ITO thin-layer already formed on its surface (hereinafter referred to as "ITO-coated glass substrate"), so that the surface opposite the side with the support film was facing the surface of the ITO thin-layer of the ITO-coated glass substrate. Next, the adhesive film and ITO-coated glass substrate were pressed via the support film while heating at 70° C., 1 MPa for 3 seconds, for temporary connection of the adhesive film on the ITO-coated glass substrate. The support film was then released from the adhesive film for transfer of the adhesive film onto the ITO-coated glass substrate. Next, a flexible wiring board (FPC) with 600 tin-plated copper circuits, having a pitch of 50 μm and a thickness of 8 μm, was situated on the adhesive film. These were then pressed in the direction of lamination at 24° C., 0.5 MPa for 1 second to obtain a temporarily anchored laminate. The laminate was situated at a prescribed position in a thermocompression bonding apparatus (heated system: constant heating, product of Toray Engineering), and pressing was carried out in the direction of lamination while heating at 160° C., 3 MPa for 10 seconds. The ITO-coated glass substrate and flexible wiring board were thus connected via a circuit-connecting member across a width of 2 mm to fabricate a circuit connection structure.

(Measurement of Connection Resistance)

The resistance value between adjacent circuits of the circuit connection structure was measured with a multimeter, immediately after bonding and after holding for 168 hours in a high-temperature, high-humidity environment of 85° C., 85% RH. The results are shown in Table 4. The resistance value was represented as the average of 37 points of resistance between adjacent circuits (x+3σ; x=mean value, σ=standard deviation).

TABLE 4

|  | Connection resistance (Ω) | | Adhesive strength (N/m) | |
|---|---|---|---|---|
|  | Immediately after bonding | After 168 hours | Immediately after bonding | After 168 hours |
| Example 6 | 1.3 | 2.8 | 740 | 620 |
| Example 7 | 1.6 | 2.6 | 860 | 680 |
| Example 8 | 1.9 | 3.2 | 920 | 700 |

TABLE 4-continued

|  | Connection resistance (Ω) | | Adhesive strength (N/m) | |
|---|---|---|---|---|
|  | Immediately after bonding | After 168 hours | Immediately after bonding | After 168 hours |
| Comp. Ex. 3 | 1.5 | 6.8 | 680 | 320 |
| Comp. Ex. 4 | 1.4 | 3.1 | 480 | 260 |

(Measurement of Adhesive Strength)

The adhesive strength between the flexible wiring board and the ITO-coated glass substrate in the circuit connection structure was measured by the 90° peel method according to JIS-Z0237. The measuring apparatus used for the adhesive strength was a TENSILON UTM-4 by Toyo Baldwin Co., Ltd. (peel rate: 50 mm/min, 25° C.). The results are shown in Table 4.

When using the adhesive films of Examples 6-8, satisfactory connection resistance and adhesive strength were exhibited immediately after bonding and after holding for 168 hours in a high-temperature, high-humidity environment of 85° C., 85% RH. On the other hand, when using the adhesive film of Comparative Example 3, the connection resistance value was satisfactory immediately after bonding but the connection resistance value increased after holding for 168 hours in a high-temperature, high-humidity environment of 85° C., 85% RH (reliability test). The adhesive strength immediately after bonding was also lower compared to Examples 6-8, while the reduction in adhesive strength after the reliability test was significant. In Comparative Example 4, the connection resistance was satisfactory but low adhesive strength was exhibited both immediately after bonding and after the reliability test. This demonstrated that using a urethane(meth)acrylate with the specific structure according to the invention can provide satisfactory connection resistance and adhesive strength.

Example 9

The adhesive film obtained in Example 6 was vacuum packaged and allowed to stand at 40° C. for three days. Thermocompression bonding of a flexible wiring board and ITO-coated glass substrate was then carried out in the same manner as Example 6 to fabricate a circuit connection structure. Measurement of the adhesive strength and connection resistance of the obtained circuit connection structure revealed an adhesive strength of 720 N/m and a connection resistance of 1.6Ω, thus demonstrating an excellent shelf life (storage stability).

Example 10

There were prepared a semiconductor chip (3×10 mm, height: 0.5 mm, with 100 μm-square gold electrodes (bumps) protruding to a height of 20 μm on the four peripheral edges of the main surface) and a semiconductor mounting substrate fabricated from a 1 mm-thick glass/epoxy substrate having connection terminals corresponding to the bump positions (18 μm-thick circuits formed of copper foil). The surface of the circuit on the semiconductor mounting substrate was nickel/gold plated. The protruding electrodes of the semiconductor chip and the semiconductor mounting substrate were connected in the following manner using the adhesive film of Example 8 described above. The circuit side of the semiconductor mounting substrate was temporarily contact bonded at 80° C., 1 MPa for 3 seconds with an adhesive film that was laminated with a support film. After then releasing the support film, the protruding electrodes of the semiconductor chip were positioned with the semiconductor mounting substrate and thermocompression bonding was carried out for 20 seconds at a temperature and pressure of 180° C., 10 kgf/chip.

This accomplished electrical connection between the protruding electrodes of the semiconductor chip and the semiconductor mounting substrate via the adhesive film. The electrodes of the semiconductor chip and the semiconductor mounting substrate were kept in this connected state by curing of the adhesive film by the thermocompression bonding. The semiconductor device obtained in this manner by connecting the semiconductor chip and semiconductor mounting substrate was subjected to a thermal cycle test, repeating a cycle of (−55° C., 30 min)/(125° C., 30 min). The thermal cycle test was repeated for 1000 cycles, and then the connection resistance between the semiconductor chip protruding electrodes and the substrate circuit was measured. As a result, virtually no increase in connection resistance was observed, demonstrating that satisfactory connection reliability was exhibited.

INDUSTRIAL APPLICABILITY

The present invention provides an adhesive composition with an excellent balance of properties, which despite being a radical curing adhesive, exhibits sufficiently high adhesive strength even for substrates composed of metals and inorganic materials, has adequately high storage stability and reliability at room temperature (20-30° C.) and satisfactory transfer properties onto adherends, and can satisfactorily achieve temporary anchoring of flexible wiring boards and the like.

The invention claimed is:
1. An adhesive composition comprising:
(a) a radical generator;
(b) a thermoplastic resin; and
(c) a urethane(meth)acrylate having two or more radical-polymerizing groups in the molecule and a weight-average molecular weight of 3000-30,000, wherein the urethane(meth)acrylate includes a divalent organic group in the molecule represented by the following formula (B), or by the following general formula (C), or by the following formula (B) and the following formula (C),

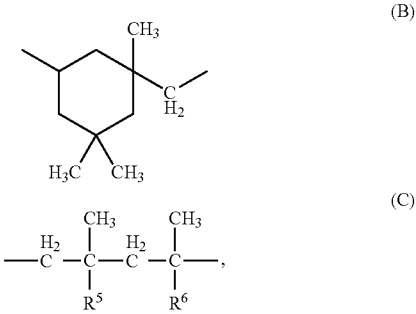

wherein in formula (C), $R^5$ and $R^6$ respectively represent hydrogen and methyl or methyl and hydrogen, and the urethane(meth)acrylate also includes in the molecule at least one group selected from the group consisting of divalent organic groups represented by the following general formulas (D), (E) and (F),

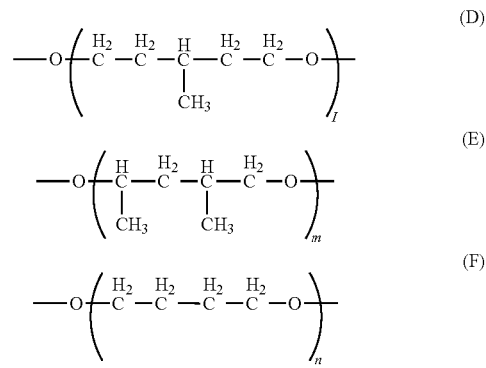

wherein in formulas (D), (E) and (F), l, m and n each represent an integer of 1-60.

2. An adhesive composition according to claim 1, wherein the urethane(meth)acrylate includes a compound represented by the following general formula (A),

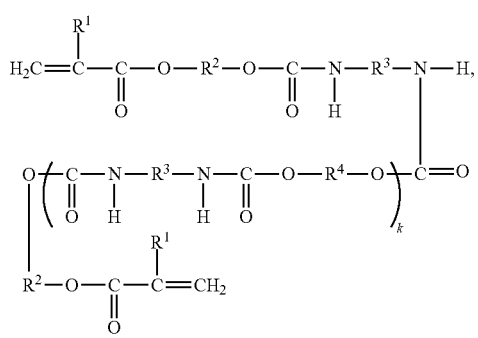

wherein in formula (A), $R^1$ represents hydrogen or a methyl group, $R^2$ represents a C1-4 straight-chain or branched alkylene group, $R^3$ represents a divalent organic group with an aliphatic hydrocarbon group, $R^4$ represents a straight-chain or branched divalent diol residue, and k represents an integer of 1-60, and the plurality of groups $R^1$, $R^2$ and $R^3$ in the molecule, and the group $R^4$ where k is an integer of 2-60, may be the same or different.

3. An adhesive composition according to claim 2, wherein $R^3$ is at least one group selected from the group consisting of divalent organic groups represented by formula (B) and the following general formula (C),

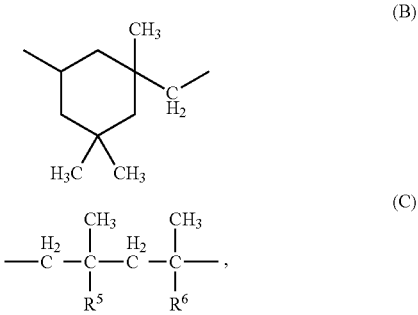

wherein in formula (C), $R^5$ and $R^6$ respectively represent hydrogen and methyl or methyl and hydrogen.

4. An adhesive composition according to claim 2, wherein the group (—O—$R^4$—O—) is at least one group selected from the group consisting of divalent organic groups represented by the following general formulas (D), (E) and (F),

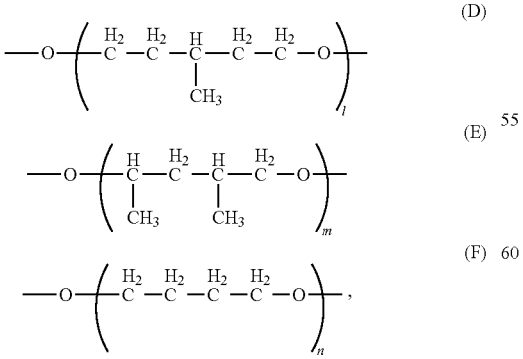

wherein in formulas (D), (E) and (F), l, m and n each represent an integer of 1-60.

5. An adhesive composition according to claim 1, wherein a temporary anchoring force of the adhesive composition for temporary anchoring to a flexible wiring board is 50 gf/cm-150 gf/cm.

6. An adhesive composition according to claim 1, wherein the 25° C. viscosity of the urethane(meth)acrylate is 5.0 Pa·s or greater.

7. An adhesive composition according to claim 1, wherein the adhesive composition comprises 10-250 parts by weight of the urethane(meth)acrylate and 0.05-30 parts by weight of the radical generator with respect to 100 parts by weight of the thermoplastic resin.

8. An adhesive composition according to claim 1, wherein the adhesive composition also comprises:

(d) a vinyl compound containing one or more phosphate groups in the molecule.

9. An adhesive composition according to claim 8, wherein the adhesive composition comprises 0.1-20 parts by weight of the vinyl compound with respect to 100 parts by weight of the thermoplastic resin.

10. An adhesive composition according to claim 1, wherein the adhesive composition further comprises:

(d) conductive particles.

11. An adhesive composition according to claim 10, wherein the adhesive composition comprises 0.5-30 parts by weight of the conductive particles with respect to 100 parts by weight of the thermoplastic resin.

12. A circuit-connecting material for electrical connection between opposing circuit electrodes, wherein the circuit-connecting material comprises an adhesive composition according to claim 1.

13. A circuit member connection structure comprising
  i. a first circuit member having a first circuit electrode formed on a main surface of a first circuit board;
  ii. a second circuit member having a second circuit electrode formed on a main surface of a second circuit board; and
  iii. a circuit-connecting member formed between the main surface of the first circuit board and the main surface of the second circuit board, wherein the circuit-connecting member electrically connects the first circuit electrode and second circuit electrode that are positioned opposite each other,
wherein the circuit-connecting member is a cured product of the circuit-connecting material according to claim 12.

14. A semiconductor device comprising
  i. a semiconductor element;
  ii. a substrate on which the semiconductor element is mounted; and
  iii. a semiconductor element connecting member provided between the semiconductor element and the substrate and electrically connecting the semiconductor element and the substrate,
wherein the semiconductor element connecting member is a cured product of the adhesive composition according to claim 1.

15. A cured product obtainable by curing the adhesive composition according to claim 1.

* * * * *